US012777962B2

(12) United States Patent
Matsuura et al.

(10) Patent No.: US 12,777,962 B2
(45) Date of Patent: Oct. 27, 2026

(54) SHIELDED LEAD PACKAGE FOR HIGH VOLTAGE DEVICES

(71) Applicant: Texas Instruments Incorporated, Dallas, TX (US)

(72) Inventors: Masamitsu Matsuura, Hiji (JP); Makoto Shibuya, Setagaya-ku (JP); Daiki Komatsu, Hiji (JP); Kengo Aoya, Beppu (JP)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 683 days.

(21) Appl. No.: 18/174,039

(22) Filed: Feb. 24, 2023

(65) Prior Publication Data

US 2024/0290676 A1 Aug. 29, 2024

(51) Int. Cl.

*H10W 74/10* (2026.01)
*H10W 40/22* (2026.01)

(Continued)

(52) U.S. Cl.

CPC ......... *H10W 74/121* (2026.01); *H10W 40/22* (2026.01); *H10W 40/228* (2026.01); *H10W 70/429* (2026.01); *H10W 70/481* (2026.01); *H10W 72/075* (2026.01); *H10W 74/01* (2026.01); *H10W 74/111* (2026.01);

(Continued)

(58) Field of Classification Search

CPC ............. H01L 23/3135; H01L 23/3107; H01L 23/367; H01L 23/4955; H01L 23/49562; H01L 23/49811; H01L 23/49833; H01L 21/56; H01L 25/16; H01L 2924/181; H01L 24/49; H10W 74/121; H10W 74/01; H10W 74/111; H10W 72/075; H10W 40/78; H10W 40/228; H10W 40/22; H10W 90/00; H10W 90/701; H10W 70/429; H10W 70/481

See application file for complete search history.

(56) References Cited

U.S. PATENT DOCUMENTS

| | | | | |
|---|---|---|---|---|
| 11,322,432 | B2 * | 5/2022 | Sugimachi | H01L 23/49562 |
| 2004/0017656 | A1 | 1/2004 | Lee et al. | |

(Continued)

OTHER PUBLICATIONS

Honsberg, Marco, Mitsuharu Tabata, and Hiroshi Sakata. “A Novel Family of 1200V Transfer Mold Converter-Inverter-Brake (CIB) Modules driven by a new 1200V High Voltage Integrated Circuit (1200V HVIC).” In Proc. of PCIM, pp. 461-468. 2005.

*Primary Examiner* — Alonzo Chambliss
(74) *Attorney, Agent, or Firm* — Ronald O. Neerings; Charles F. Koch

(57) ABSTRACT

A microelectronic device includes one or more electronic components attached to a package substrate which has an exposed surface to provide an area for mounting a heatsink. The microelectronic device includes one or more leads that are electrically connected to the electronic component. The lead extends away from the exposed surface of the package substrate. The microelectronic device includes a shielding dielectric material that laterally surrounds the lead and extends over the lead between the lead and the exposed surface of the package substrate. An electronic system includes the microelectronic device and a circuit board electrically connected to the lead. The electronic system also includes a heatsink attached to the exposed surface of the package substrate.

20 Claims, 24 Drawing Sheets

(51) Int. Cl.

| | |
|---|---|
| ***H10W 70/40*** | (2026.01) |
| ***H10W 72/00*** | (2026.01) |
| ***H10W 74/01*** | (2026.01) |
| ***H10W 90/00*** | (2026.01) |
| *H10W 72/30* | (2026.01) |
| *H10W 72/50* | (2026.01) |
| *H10W 72/60* | (2026.01) |
| *H10W 72/90* | (2026.01) |

(52) U.S. Cl.

CPC ......... *H10W 90/00* (2026.01); *H10W 90/701* (2026.01); *H10W 70/475* (2026.01); *H10W 72/354* (2026.01); *H10W 72/5445* (2026.01); *H10W 72/5449* (2026.01); *H10W 72/5473* (2026.01); *H10W 72/552* (2026.01); *H10W 72/5522* (2026.01); *H10W 72/5524* (2026.01); *H10W 72/5525* (2026.01); *H10W 72/555* (2026.01); *H10W 72/646* (2026.01); *H10W 72/871* (2026.01); *H10W 72/877* (2026.01); *H10W 72/884* (2026.01); *H10W 72/926* (2026.01); *H10W 72/932* (2026.01); *H10W 72/936* (2026.01); *H10W 90/401* (2026.01); *H10W 90/734* (2026.01); *H10W 90/736* (2026.01); *H10W 90/754* (2026.01); *H10W 90/755* (2026.01); *H10W 90/763* (2026.01)

(56) References Cited

U.S. PATENT DOCUMENTS

| | | | | |
|---|---|---|---|---|
| 2006/0056213 | A1* | 3/2006 | Lee | H01L 25/165<br>257/E25.031 |
| 2007/0132074 | A1 | 6/2007 | Tsai | |
| 2015/0028462 | A1* | 1/2015 | Hasegawa | H01L 24/48<br>257/675 |
| 2020/0411420 | A1* | 12/2020 | Koduri | H01L 21/4842 |
| 2023/0245942 | A1* | 8/2023 | Kim | H01L 23/34<br>257/675 |

* cited by examiner

SHIELDED LEAD PACKAGE FOR HIGH VOLTAGE DEVICES

TECHNICAL FIELD

This disclosure relates to the field of microelectronic devices. More particularly, but not exclusively, this disclosure relates to microelectronic devices that are compatible with heatsinks.

BACKGROUND

Some microelectronic devices require heatsinks to operate reliably. The heatsinks are commonly attached to the microelectronic devices using thermally conductive material. Use of heatsinks on microelectronic devices operating at several hundred volts requires consideration of possible current leakage.

SUMMARY

The present disclosure introduces a microelectronic device including an electronic component attached to a package substrate. A surface of the package substrate is exposed on the microelectronic device. The microelectronic device includes a lead that is electrically connected to the electronic component. The lead extends away from the exposed surface of the package substrate. The microelectronic device includes a shielding dielectric material that laterally surrounds the lead and shields the lead from the exposed surface of the package substrate.

The present disclosure further introduces an electronic system which includes the microelectronic device and a circuit board electrically connected to the lead. The electronic system further includes a heatsink attached to the exposed surface of the package substrate.

DETAILED DESCRIPTION

Figure 1A:
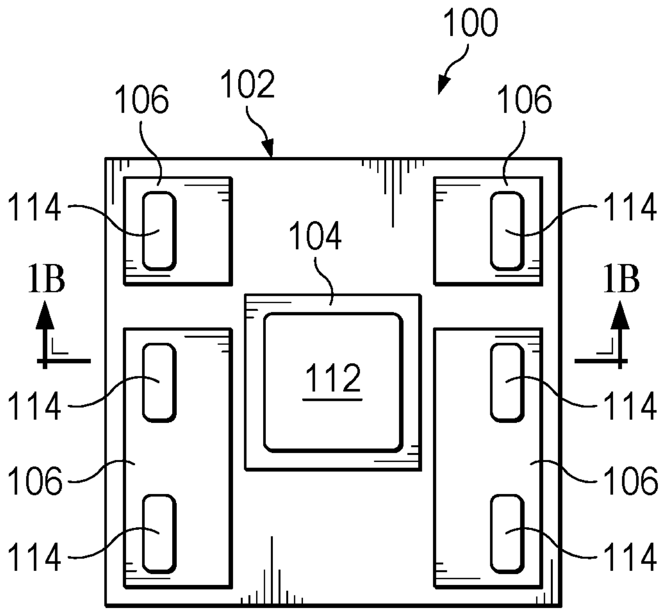
FIG. 1A through FIG. 1Q are top views and cross sections of an example microelectronic device, depicted in stages of an example method of formation.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

The present disclosure introduces a microelectronic device including one or more electronic components. The electronic components may be any combination of integrated circuits, discrete components such as transistors, and passive components such as resistors and capacitors. At least one of the electronic components is attached to a package substrate. The microelectronic device also includes at least one lead, which is electrically conductive, that is electrically connected to at least one of the electronic components. The microelectronic device further includes an encapsulation material, which is electrically non-conductive, contacting the electronic components, the package substrate, and the lead. The package substrate extends through the encapsulation material so that a surface of the package substrate is exposed on the microelectronic device. The lead extends away from the exposed surface of the package substrate. The microelectronic device may include a carrier located opposite from the exposed surface of the package substrate, with the lead extending through the carrier. The microelectronic device includes a shielding dielectric material that laterally surrounds the lead, and covers the lead, shielding the lead from the exposed surface of the package substrate.

In one aspect of this disclosure, a partially formed version of the microelectronic device, including the electronic components, the package substrate, the lead, and the encapsulation material, may be provided, and the microelectronic device may be formed by forming the shielding dielectric material so as to laterally surround the lead and cover the lead. In another aspect, the microelectronic device may be formed by attaching at least one of the electronic components to the package substrate, and forming an electrical connection to the lead. Formation of the microelectronic device is continued by forming the encapsulation material on the electronic components, the package substrate, and the lead. The lead is subsequently shaped to extend away from the exposed surface of the package substrate. The carrier may be attached to the encapsulation material, with the lead extending through the carrier. Formation of the microelectronic device is continued by forming the shielding dielectric material to laterally surround the lead and cover the lead.

The microelectronic device may be part of an electronic system which includes the microelectronic device and a circuit board electrically connected to the lead. The electronic system further includes a heatsink attached to the exposed surface of the package substrate. The heatsink may extend laterally past the encapsulation material and the shielding dielectric material, advantageously enabling more efficient heat transfer from the electronic component that is attached to the package substrate. The shielding dielectric material reduces, or prevents, leakage current between the heatsink and the lead.

For the purposes of this disclosure, the term "laterally" refers to a direction parallel to the exposed surface of the package substrate. The term "vertical" refers to a direction perpendicular to the exposed surface of the package substrate.

Figure 1B:
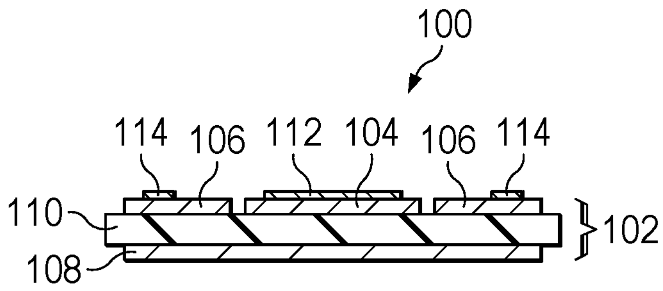
Figure 1C:
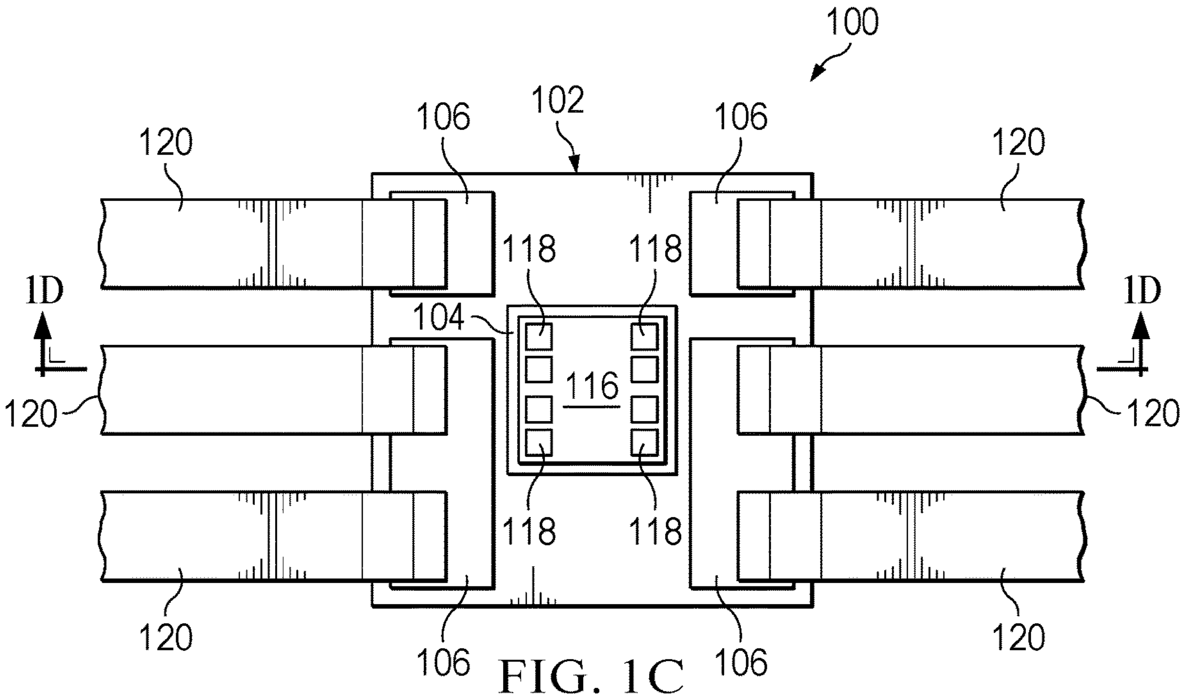
Figure 1D:
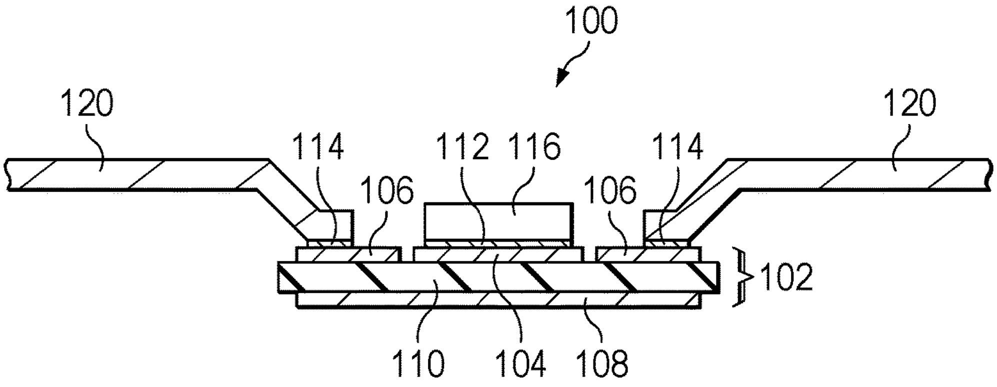
Figure 1E:
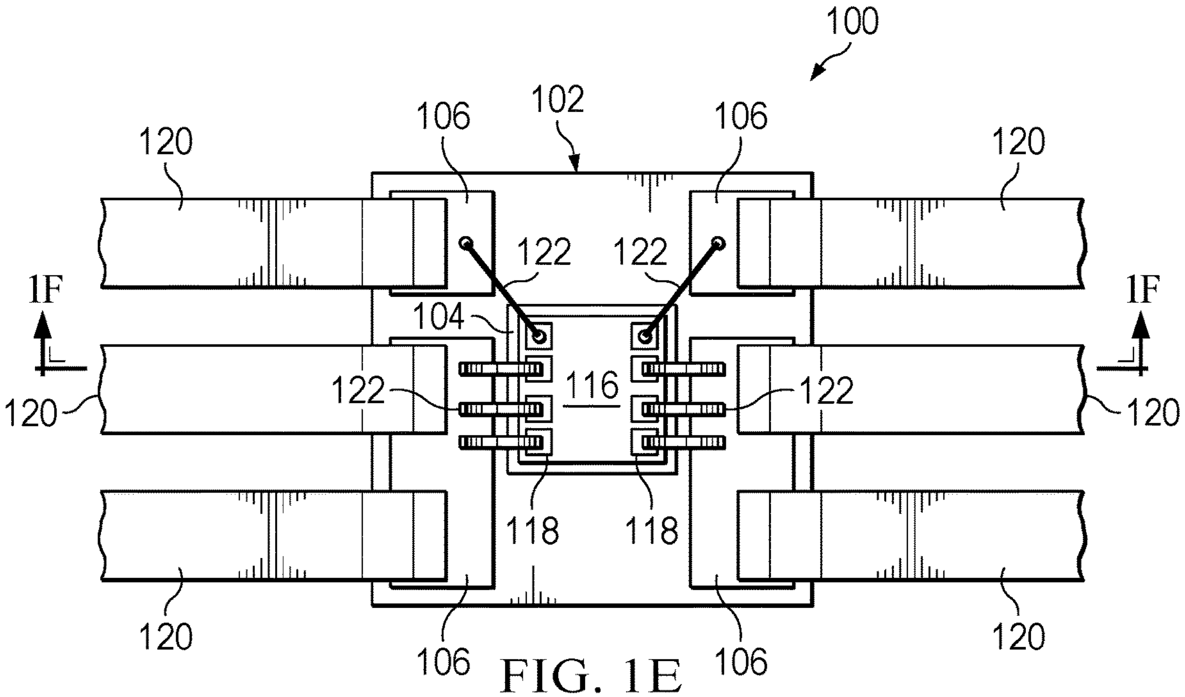
Figure 1F:
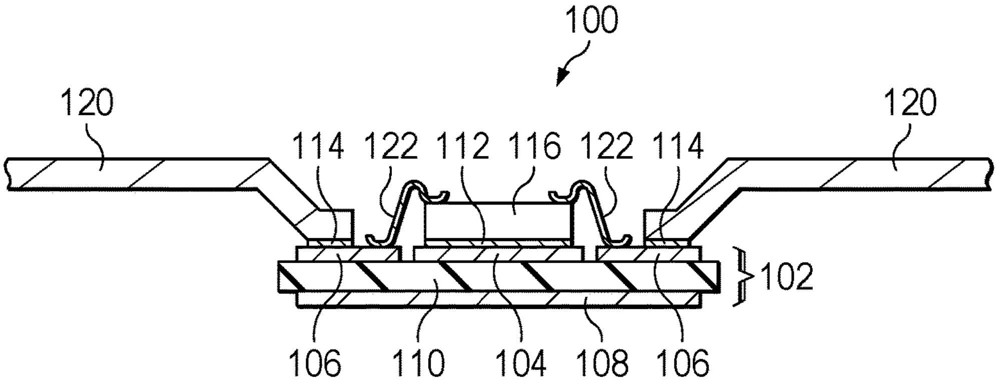
Figure 1G:
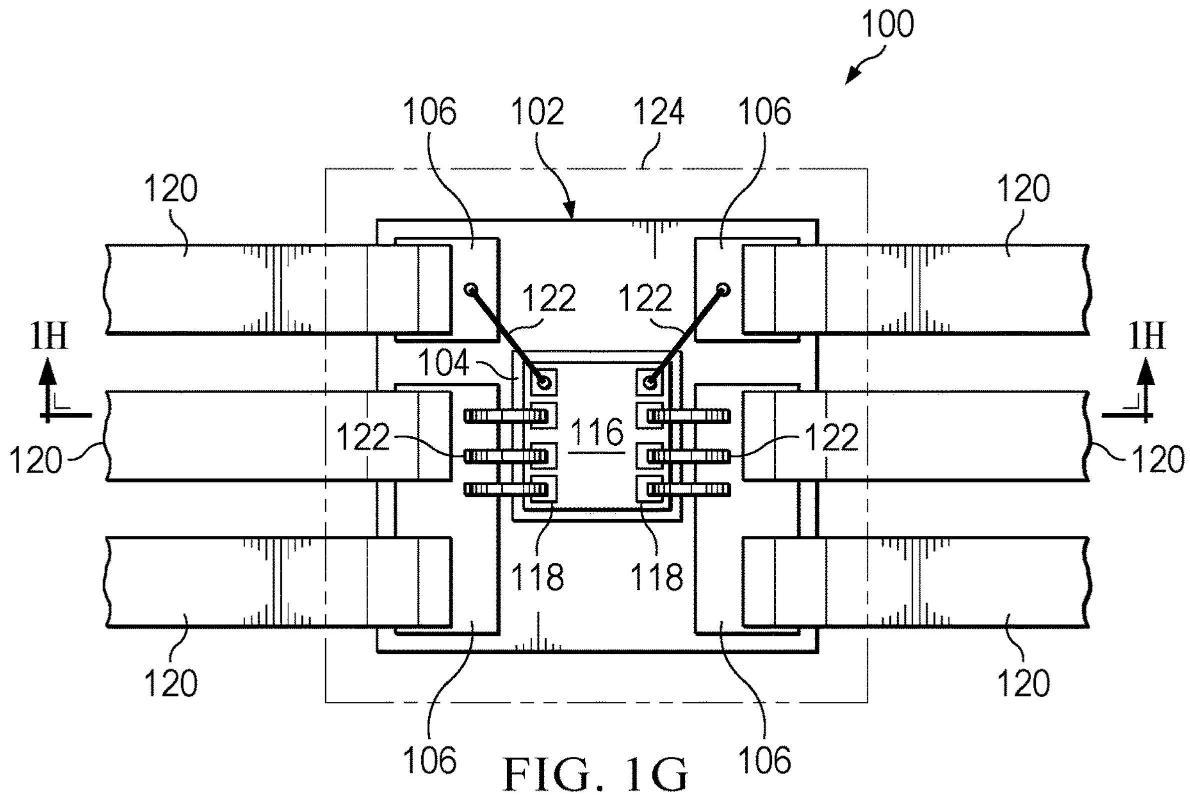
Figure 1H:
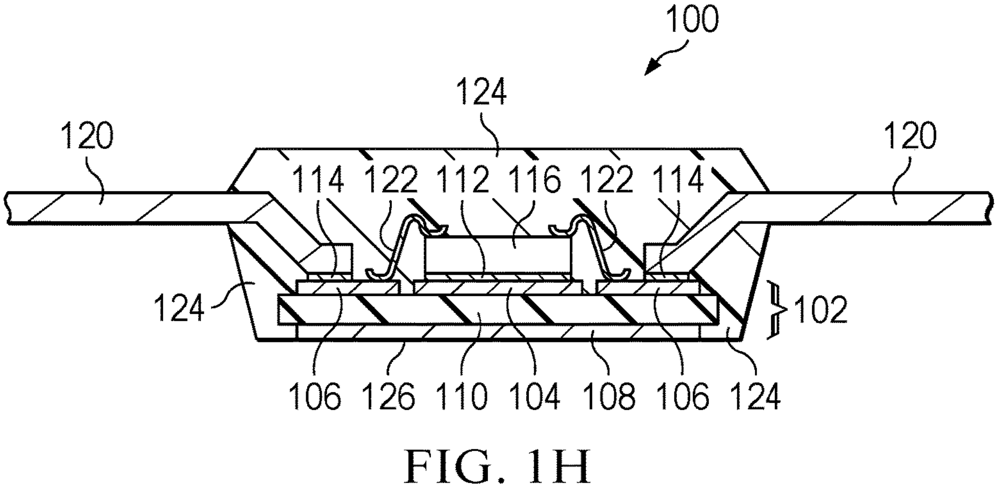
Figure 1I:
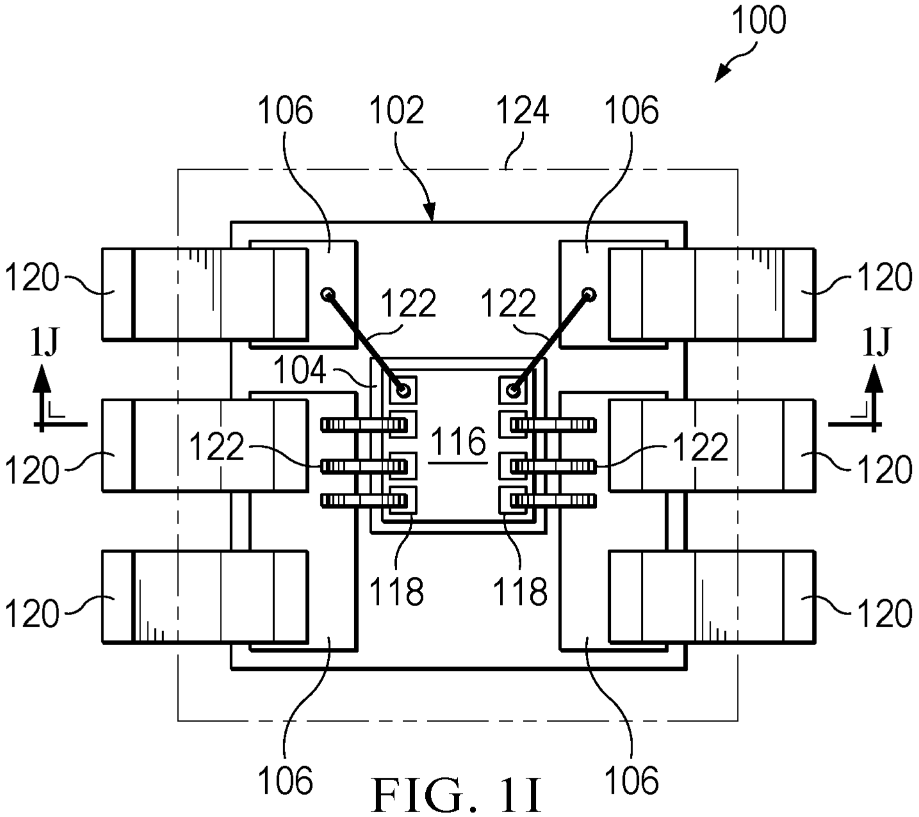
Figure 1J:
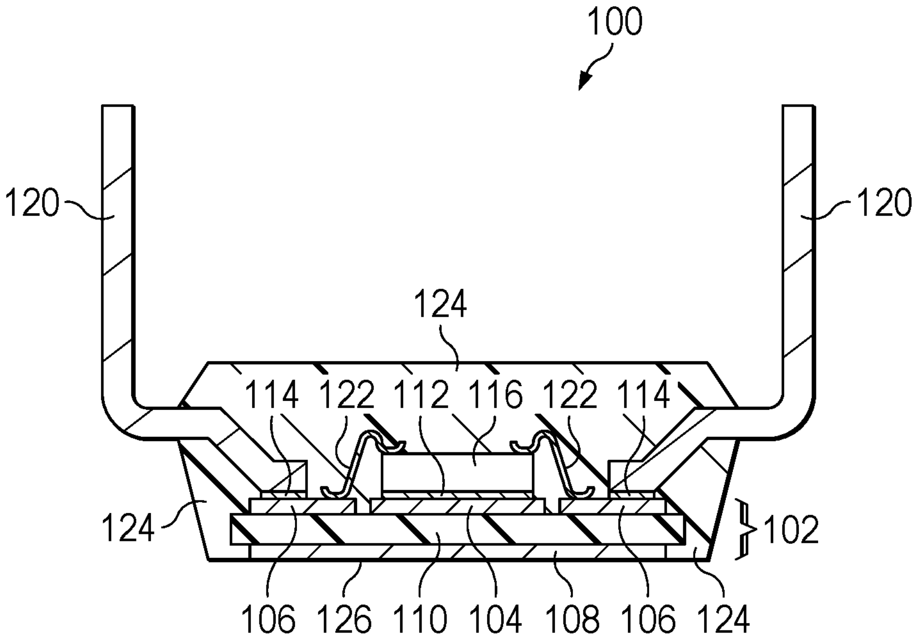
Figure 1K:
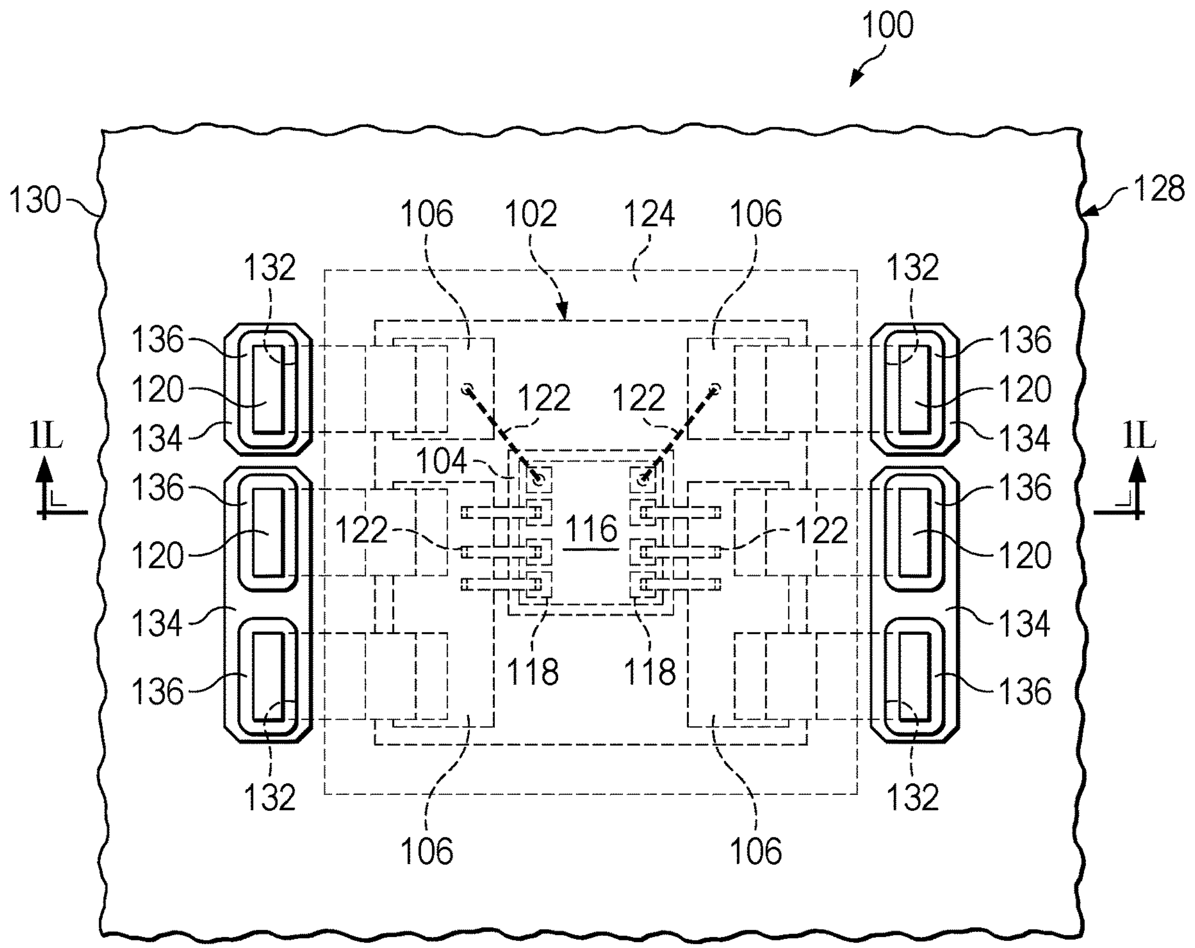
Figure 1L:
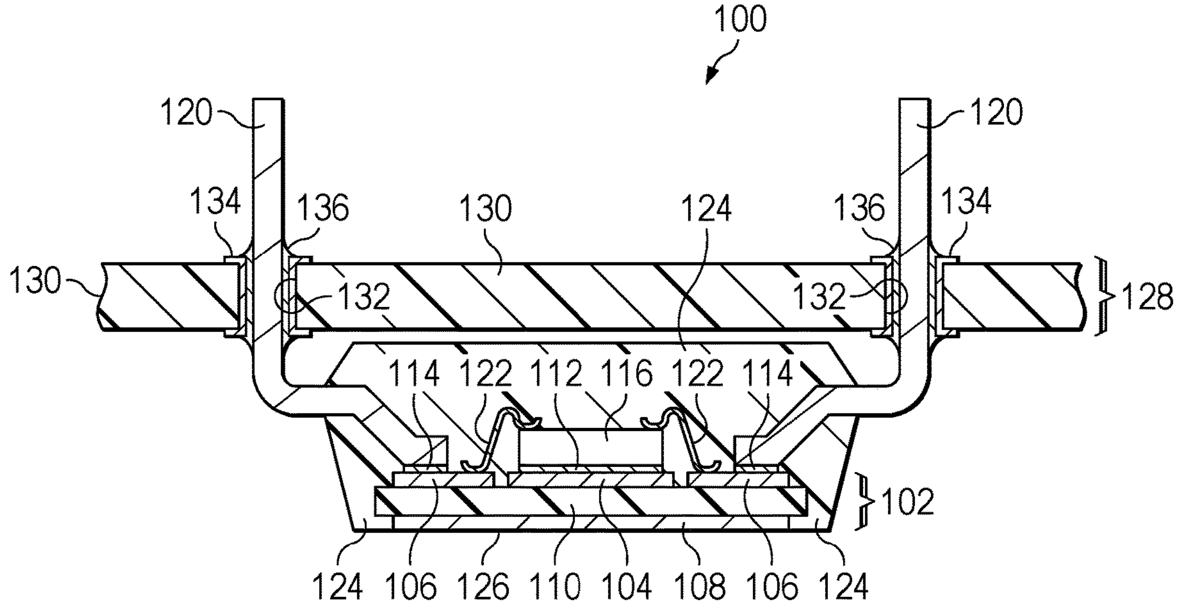
Figure 1M:
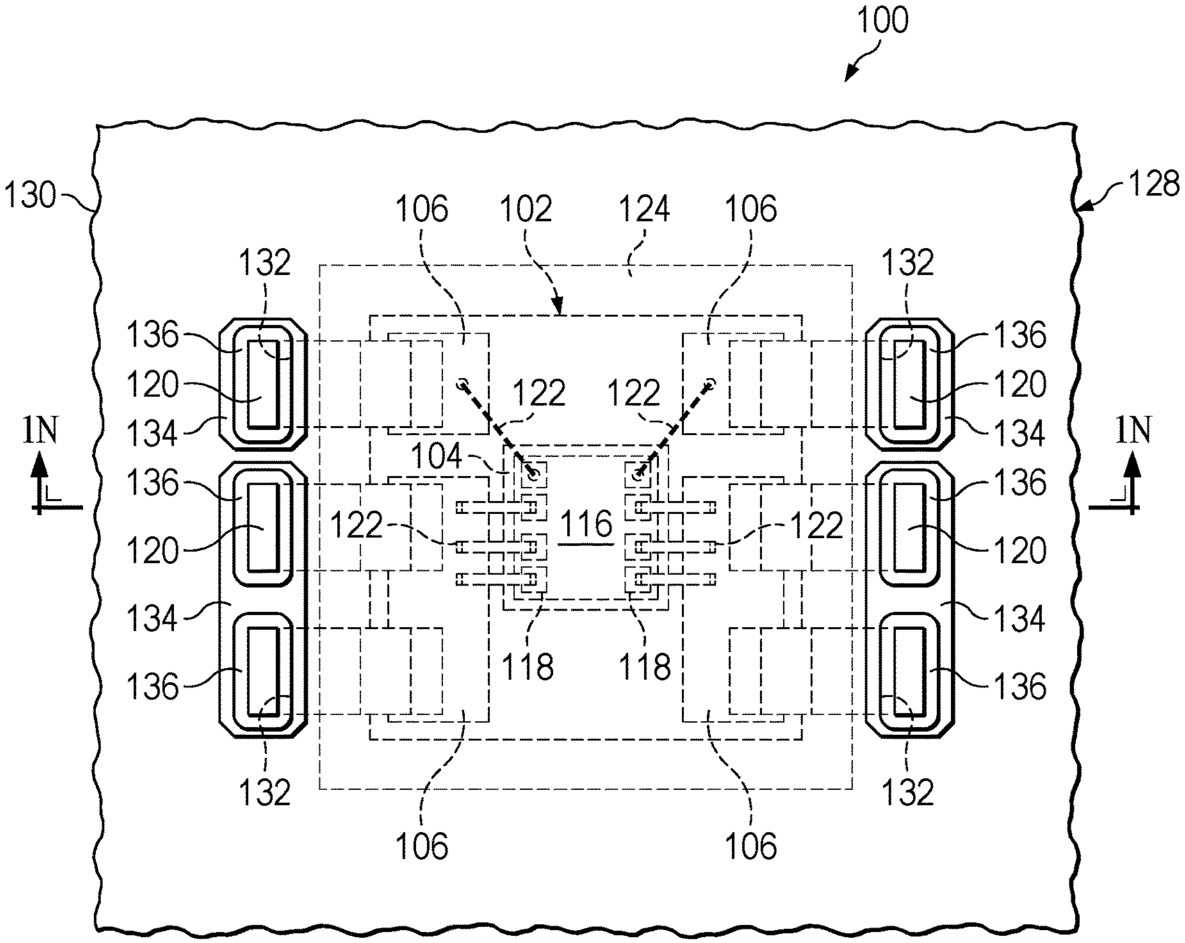
Figure 1N:
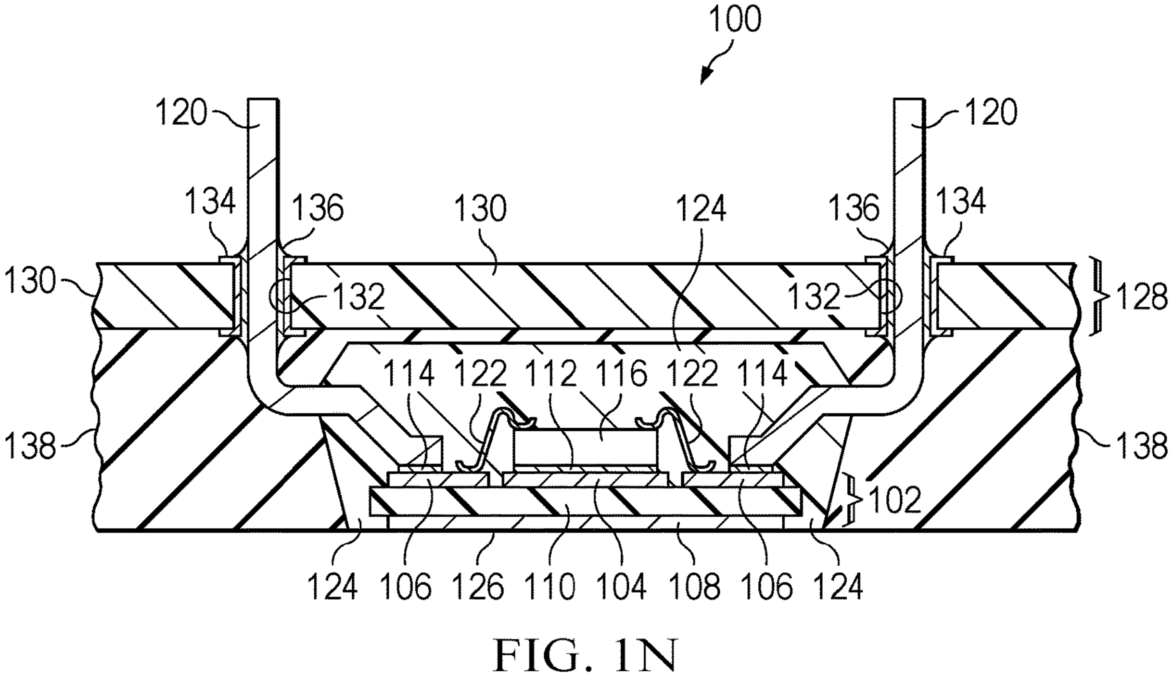
Figure 1O:
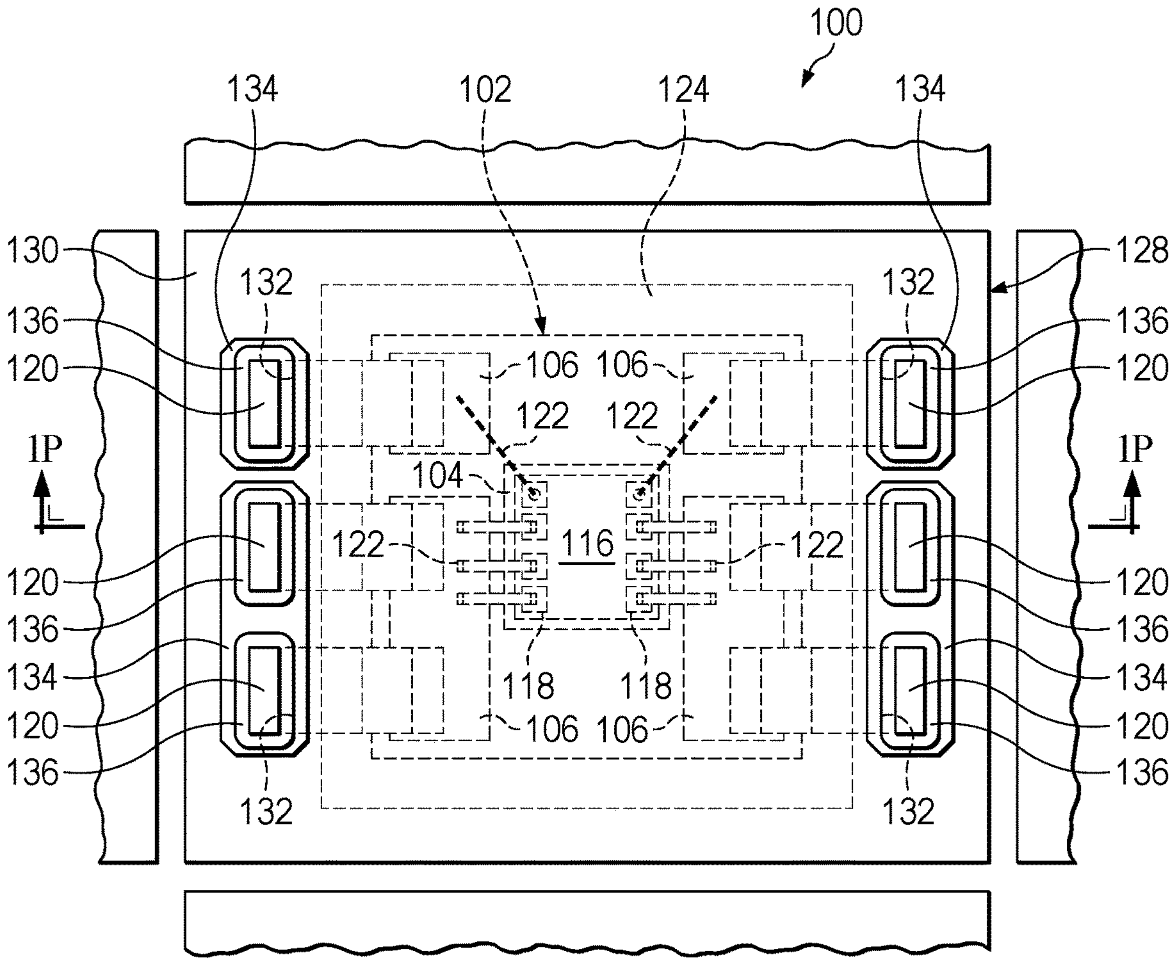
Figure 1P:
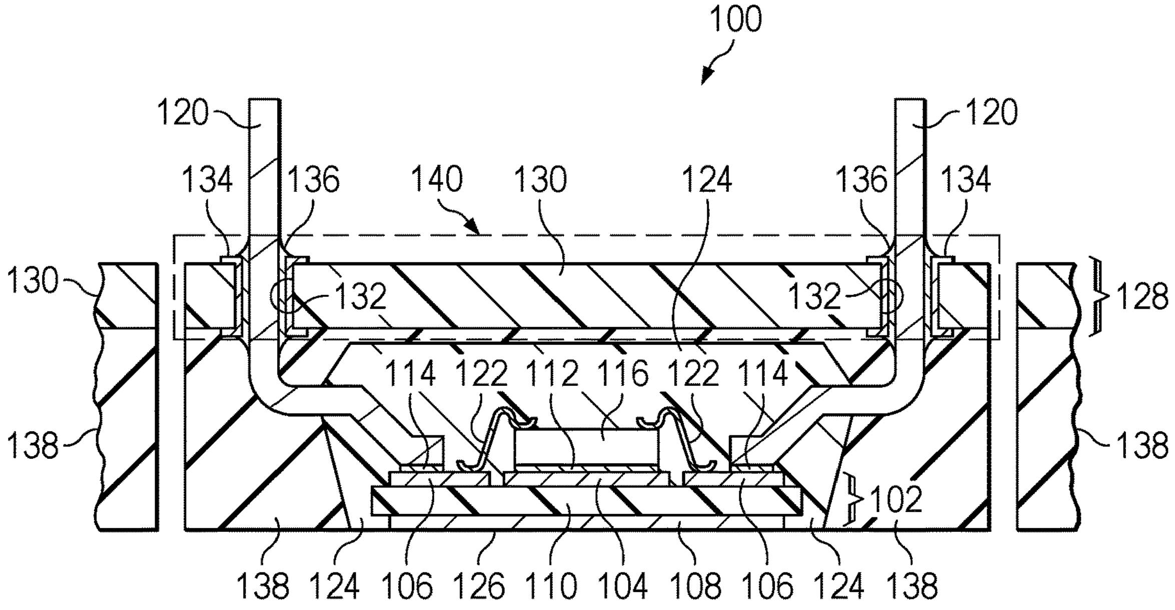
Figure 1Q:
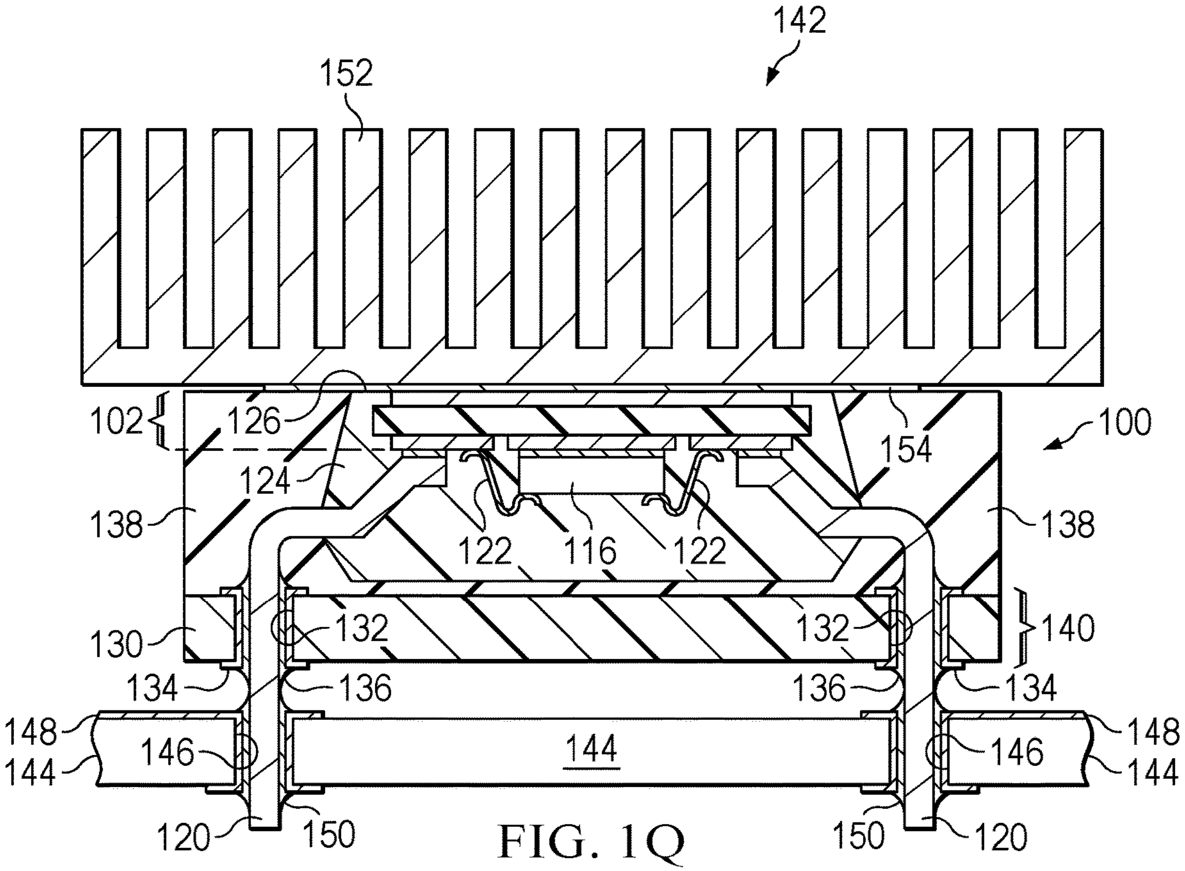

FIG. 1A through FIG. 1Q are top views and cross sections of an example microelectronic device, depicted in stages of an example method of formation. Referring to FIG. 1A, a top view, and FIG. 1B, a cross section, the microelectronic device (100) includes a package substrate (102). The package substrate (102) of this example includes a die pad (104) and lead pads (106). The package substrate (102) may be formed of a double bonded copper (DBC) lamina or an insulated metal substrate (IMS), by way of example. The package substrate (102) may include a back pad (108) that is electrically conductive, and a dielectric lamina (110) separating the back pad (108) from the die pad (104) and the lead pads (106).

A die attach material (112) is applied to the die pad (104) and a lead attach material (114) is applied to the lead pads (106). The die attach material (112) may be electrically non-conductive material, such as an epoxy-based paste, or may be an electrically conductive material, such as solder paste or metal-filled epoxy. The lead attach material (114) is electrically conductive, and may have the same composition as the die attach material (112). The die attach material (112) and the lead attach material (114) may be applied by screen printing or dispensing, concurrently or separately, by way of example.

Referring to FIG. 1C, a top view, and FIG. 1D, a cross section, an electronic component (116) is disposed on the die attach material (112). The electronic component (116) may be manifested as an integrated circuit or a discrete transistor, such as a silicon metal oxide semiconductor field effect transistor (MOSFET) or a gallium nitride field effect transistor (GaN FET), by way of example. The electronic component (116) of this example includes bond pads (118).

Leads (120) are disposed on the lead attach material (114). The leads (120) are electrically conductive, and may be part of a lead frame, not shown.

Subsequently, the die attach material (112) and the lead attach material (114) are heated to attach the electronic component (116) to the die pad (104), and to form electrical connections between the leads (120) and the lead pads (106). In versions of this example in which the die attach material (112) and the lead attach material (114) includes solder paste, heating the die attach material (112) and the lead attach material (114) causes solder in the die attach material (112) and the lead attach material (114) to reflow and form the electrical connections. In versions of this example in which the die attach material (112) and the lead attach material (114) includes metal-filled epoxy, heating the die attach material (112) and the lead attach material (114) causes the epoxy to cure, forming the electrical connections.

Referring to FIG. 1E, a top view, and FIG. 1F, a cross section, electrical connections (122) are formed between the electronic component (116) and the lead pads (106). The electrical connections (122) may be implemented as ribbon bonds, wire ball bonds, wire wedge bonds, or any combination thereof. Instances of the electrical connections (122) carrying higher currents, such as source and drain connections, may be implemented as ribbon bonds or multiple wire bonds. The electrical connections (122) may include copper, palladium coated copper (PCC), aluminum, or gold, by way of example. Other instances of the electrical connections (122) carrying lower currents, such as gate and body connections, may be implemented as single wire bonds. Other implementations for the electrical connections (122), such as clips, or connections formed by additive processes, are within the scope of this example.

Referring to FIG. 1G, a top view, and FIG. 1H, a cross section, an encapsulation material (124) is formed on the package substrate (102), the electronic component (116), the leads (120), and the electrical connections (122). An exposed surface (126) of the package substrate (102) extends through the encapsulation material (124) and is exposed on the microelectronic device (100). The encapsulation material (124) may include epoxy with silicon dioxide filler, by way of example. The encapsulation material (124) may be formed by a film assisted molding (FAM) process to facilitate keeping the exposed surface (126) of the package substrate (102) free of the encapsulation material (124).

Referring to FIG. 1I, a top view, and FIG. 1J, a cross section, the leads (120) are trimmed to separate the leads (120) from the lead frame. Subsequently, the leads (120) are shaped so that ends of the leads (120) extend away from the exposed surface (126) of the package substrate (102).

Referring to FIG. 1K, a top view, and FIG. 1L, a cross section, a carrier plate (128) is attached to the leads (120), so that the carrier plate (128) is located opposite from the exposed surface (126) of the package substrate (102). In this example, the carrier plate (128) includes a carrier body (130) having holes (132) that extend through the carrier body (130). The holes (132) are lined with metal traces (134) of the carrier plate (128). The carrier body (130) may include fiber reinforced polymer (FRP) such as FR4. The carrier plate (128) is attached so that the leads (120) extend through the holes (132). Solder (136) is applied to the leads (120) at the holes (132), securing the leads (120) to the carrier plate (128). The carrier plate (128) may accommodate multiple other microelectronic devices, not shown.

Referring to FIG. 1M, a top view, and FIG. 1N, a cross section, a shielding dielectric material (138) is formed on the leads (120), the carrier plate (128), and the encapsulation material (124). The shielding dielectric material (138) laterally surrounds the leads (120), and extends over the leads (120) between the leads (120) and the exposed surface (126) of the package substrate (102). The shielding dielectric material (138) may include epoxy or other polymer material. The shielding dielectric material (138) may include silicon dioxide filler. The shielding dielectric material (138) may have a composition similar to the encapsulation material (124). The exposed surface (126) of the package substrate (102) remains free of the shielding dielectric material (138). The shielding dielectric material (138) may be formed by an FAM process, to facilitate keeping the exposed surface (126) of the package substrate (102) free of the shielding dielectric material (138). In one version of this example, the shielding dielectric material (138) may be coplanar with the exposed surface (126), as depicted in FIG. 1N. In another version, the shielding dielectric material (138) may be recessed from the exposed surface (126). The solder (136) in the holes (132) may advantageously reduce, or eliminate, leakage of the shielding dielectric material (138) through the holes (132).

Referring to FIG. 1O, a top view, and FIG. 1P, a cross section, the microelectronic device (100) is singulated by cutting through the carrier plate (128) and the shielding dielectric material (138). The portion of the carrier plate (128) attached to the leads (120) after singulation provides a carrier (140) of the microelectronic device (100). The carrier plate (128) and the shielding dielectric material (138) may be cut by a saw process, a water jet process, a laser cutting process, or other singulation process.

Referring to FIG. 1Q, a cross section, the microelectronic device (100) is installed in an electronic system (142). The electronic system (142) includes a circuit board (144) with plated through holes (146) connected to traces (148). The microelectronic device (100) is mounted in the circuit board (144), with the leads (120) extending through the plated through holes (146) and electrically connected to the traces (148) with solder (150).

A heatsink (152) is installed on the exposed surface (126) of the package substrate (102) with a thermally conductive material (154) such as thermal grease or epoxy with aluminum nitride filler. In this example, the heatsink (152) may be manifested as a metal plate with cooling fins, made of copper or aluminum. The heatsink (152) may extend laterally past the shielding dielectric material (138), as depicted in FIG. 1Q, to advantageously remove more heat from the electronic component (116) than a heatsink that is confined to a perimeter of the encapsulation material (124).

Figure 2A:
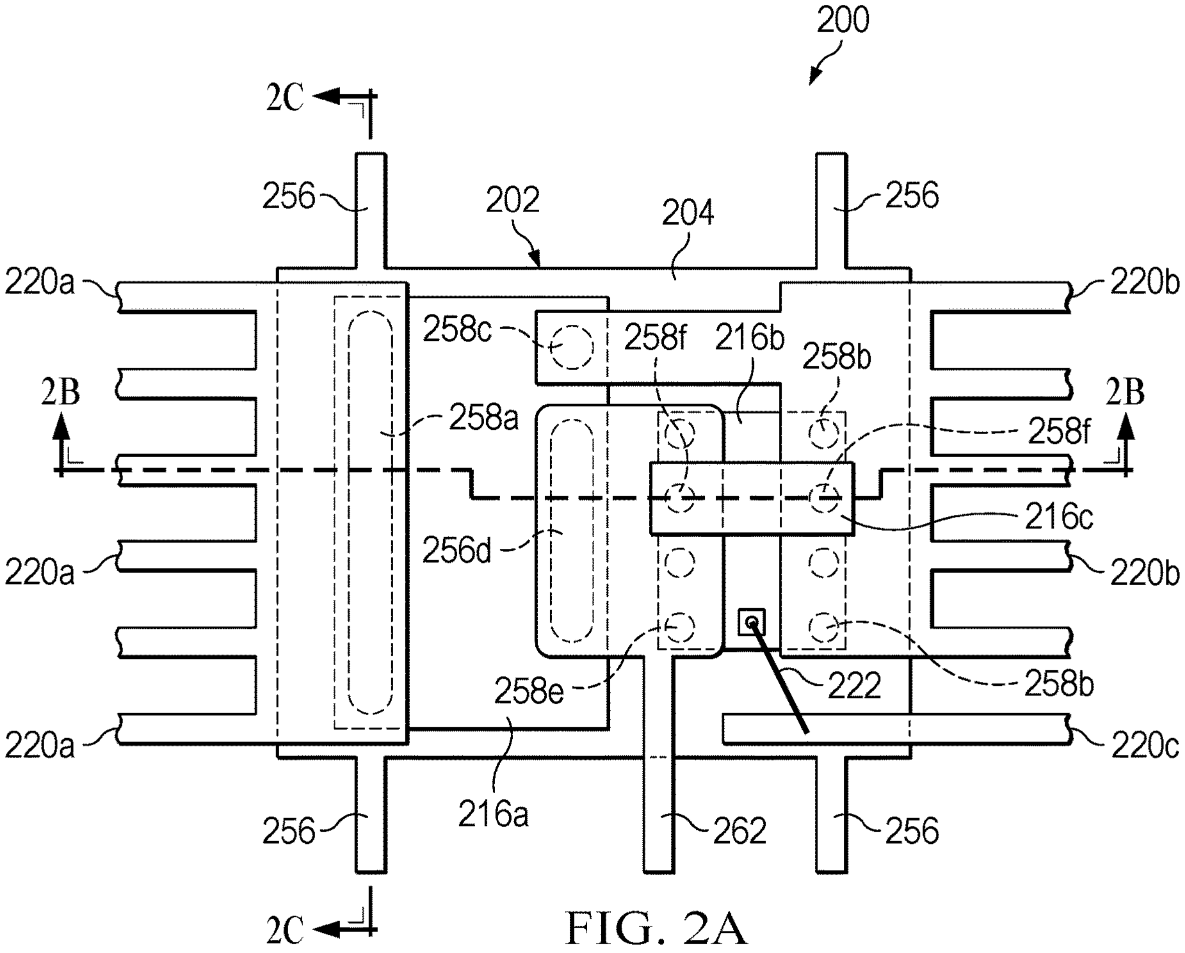
FIG. 2A through FIG. 2R are top views and cross sections of another example microelectronic device, depicted in stages of another example method of formation.
Figure 2B:
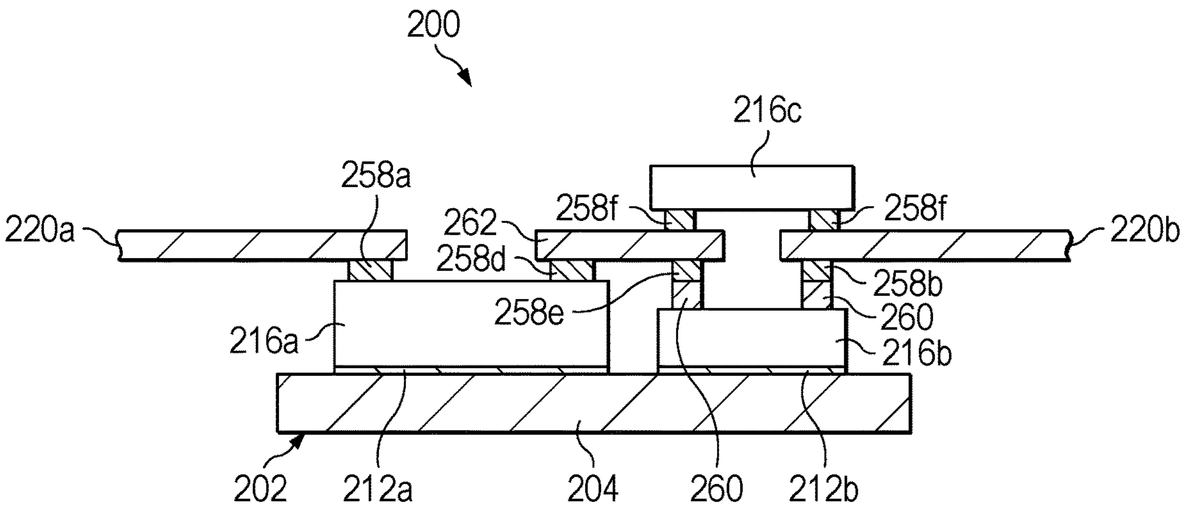
Figure 2C:
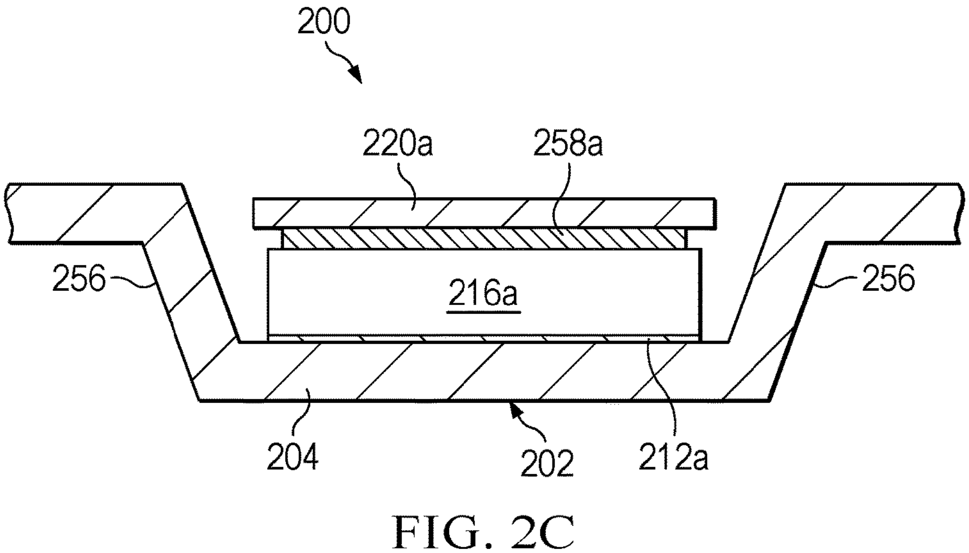
Figure 2D:
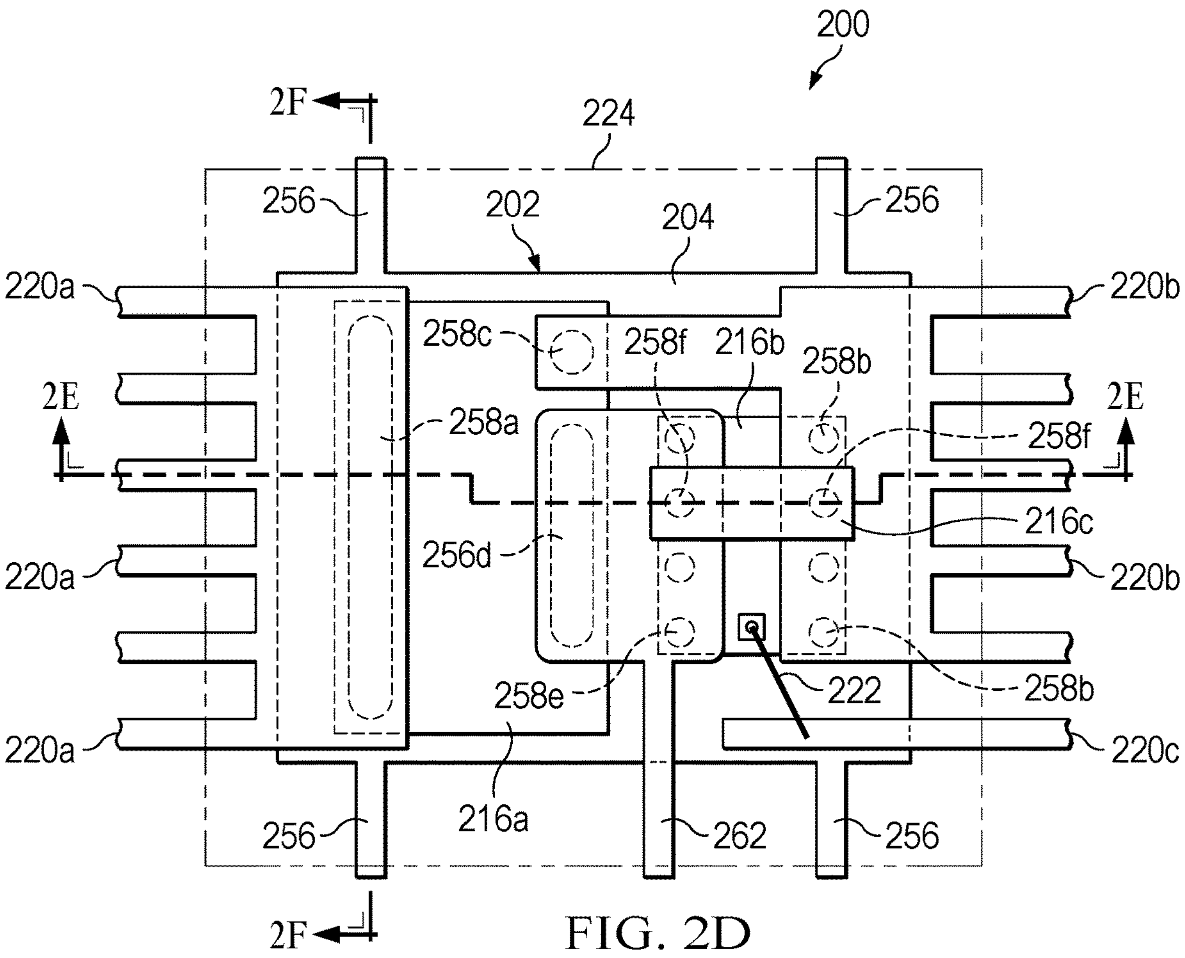
Figure 2E:
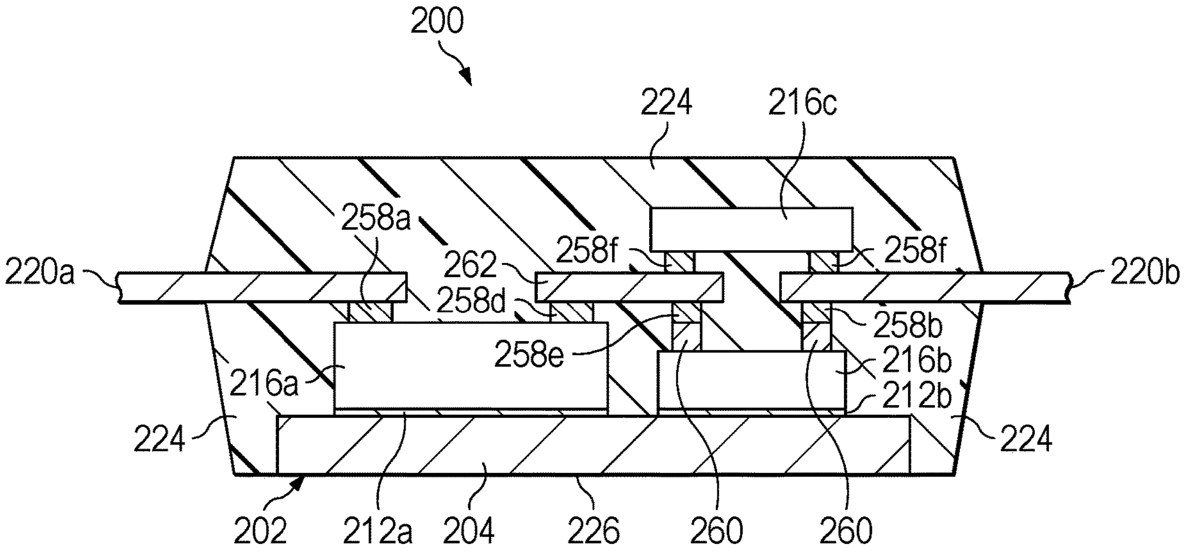
Figure 2F:
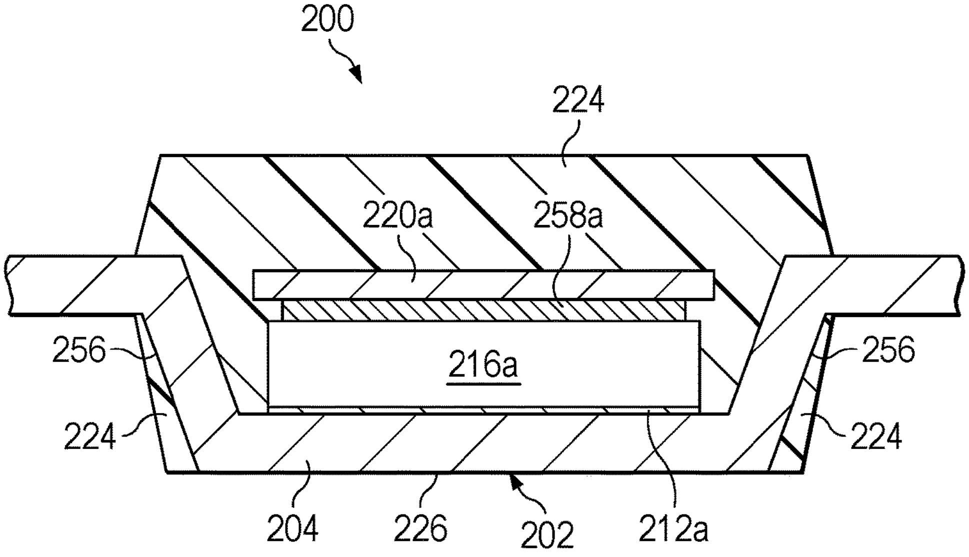
Figure 2G:
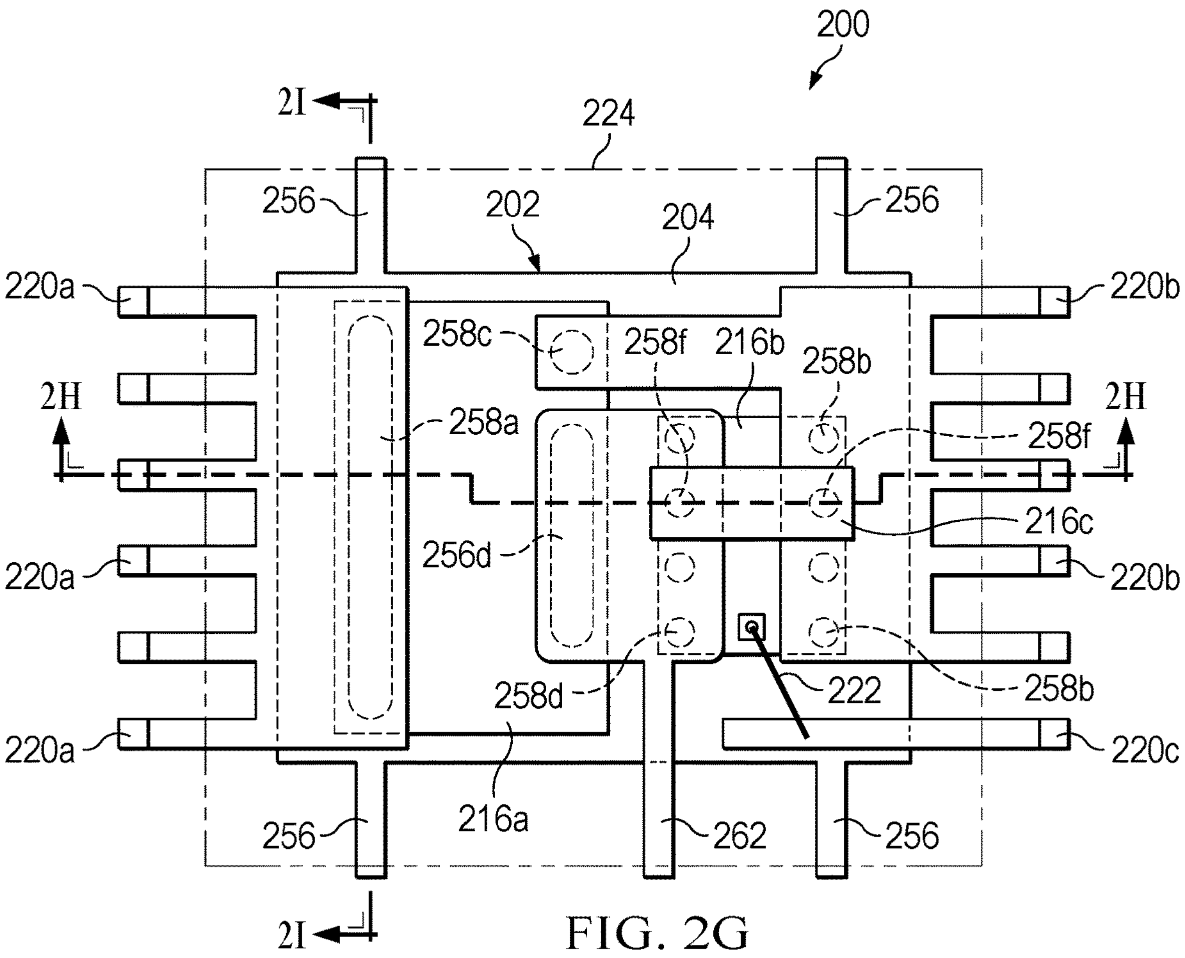
Figure 2H:
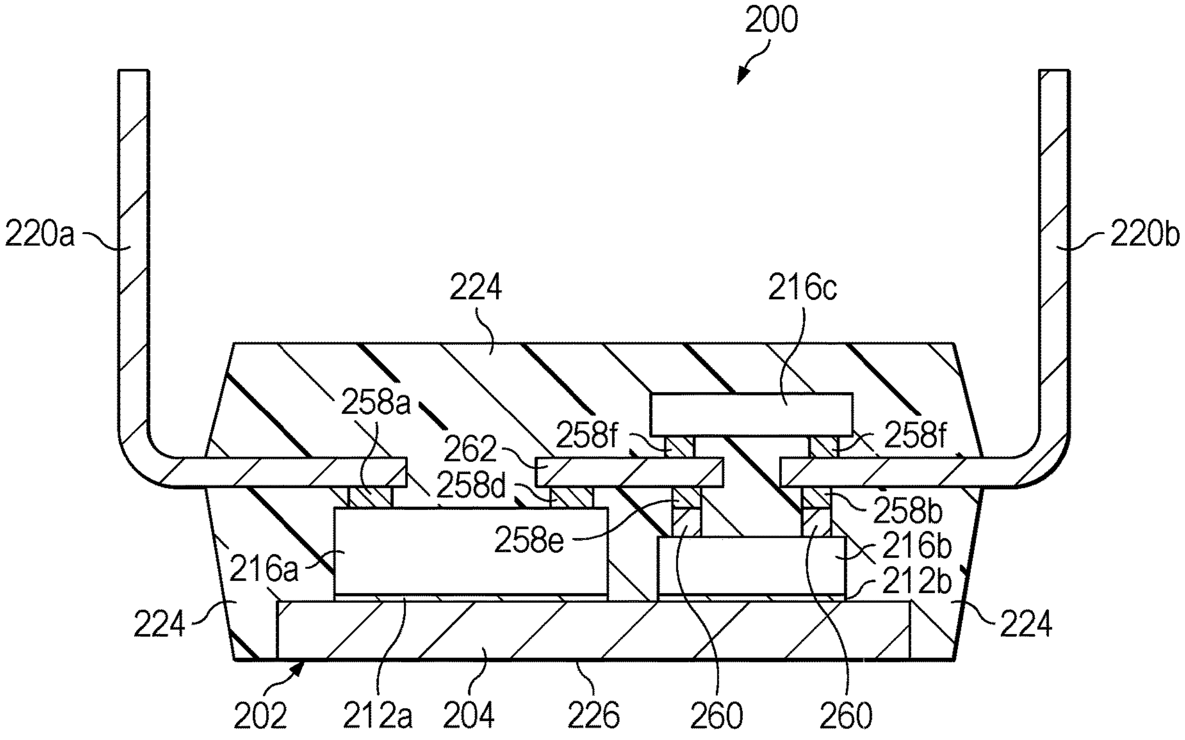
Figure 2I:
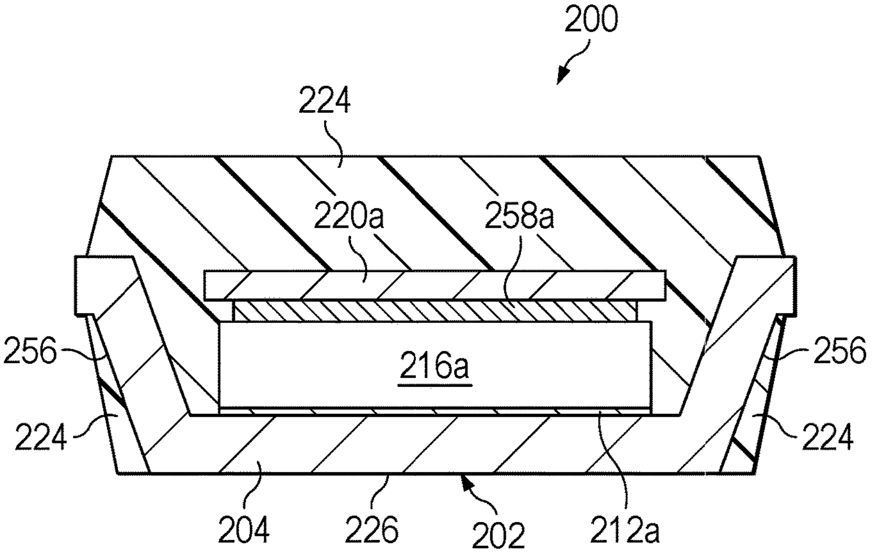
Figure 2J:
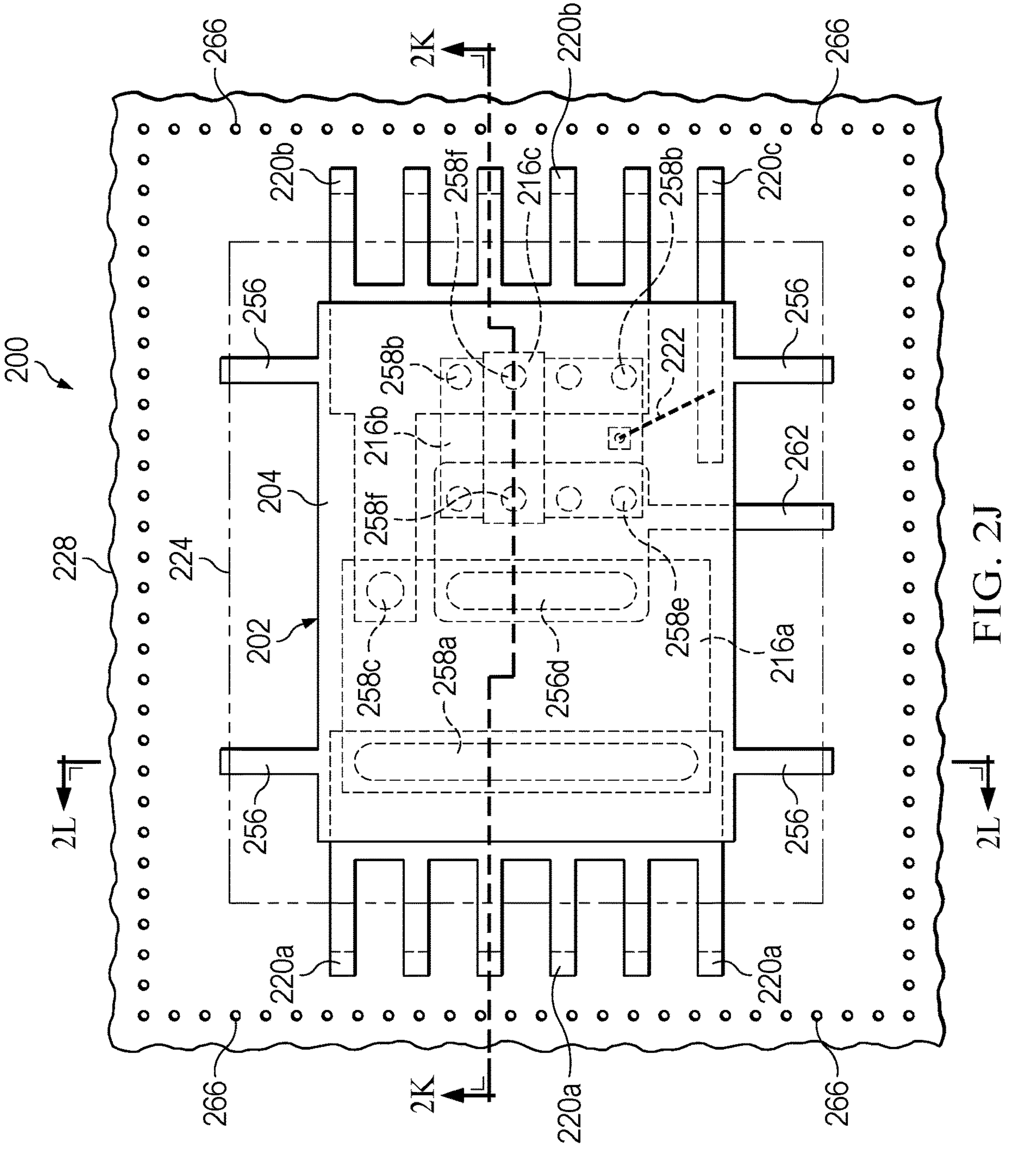
Figure 2K:
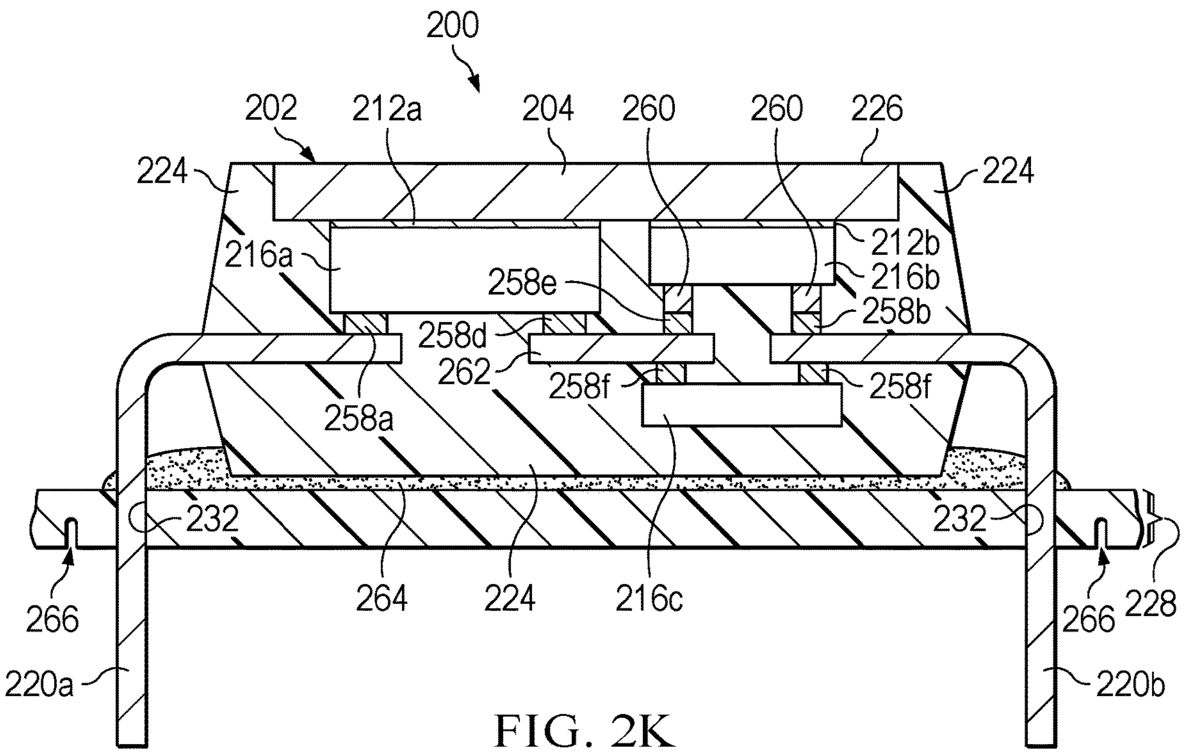
Figure 2L:
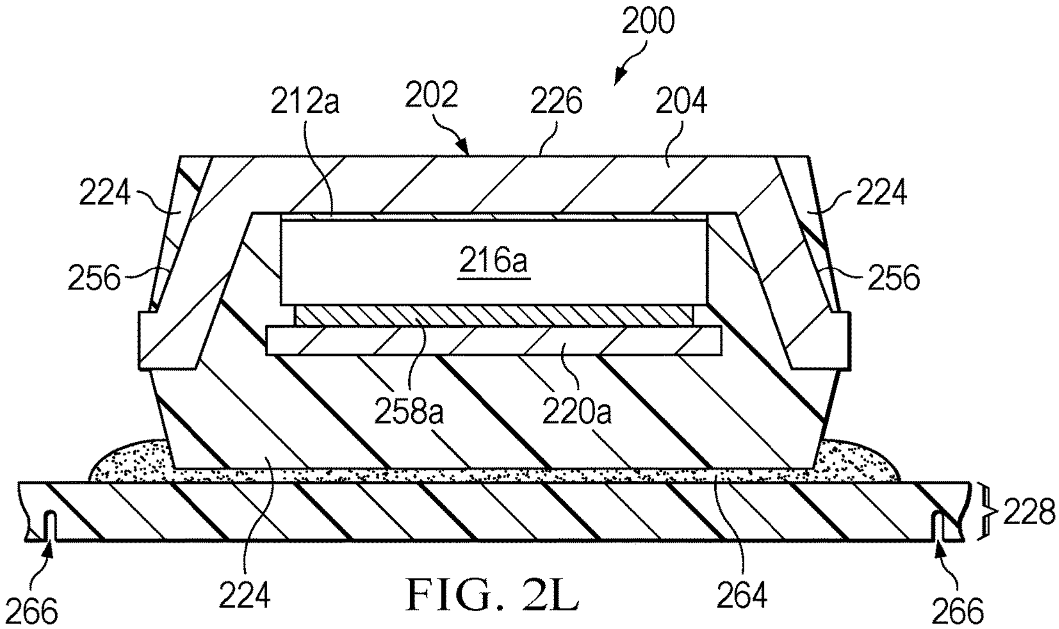
Figure 2M:
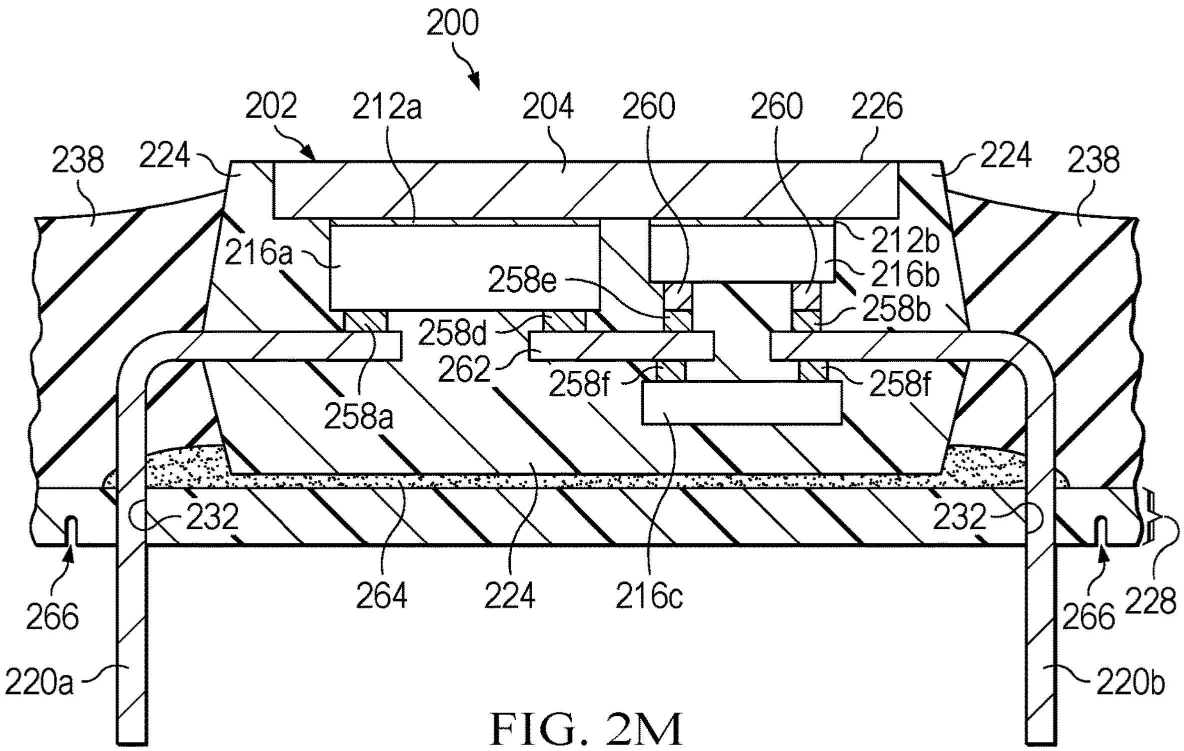
Figure 2N:
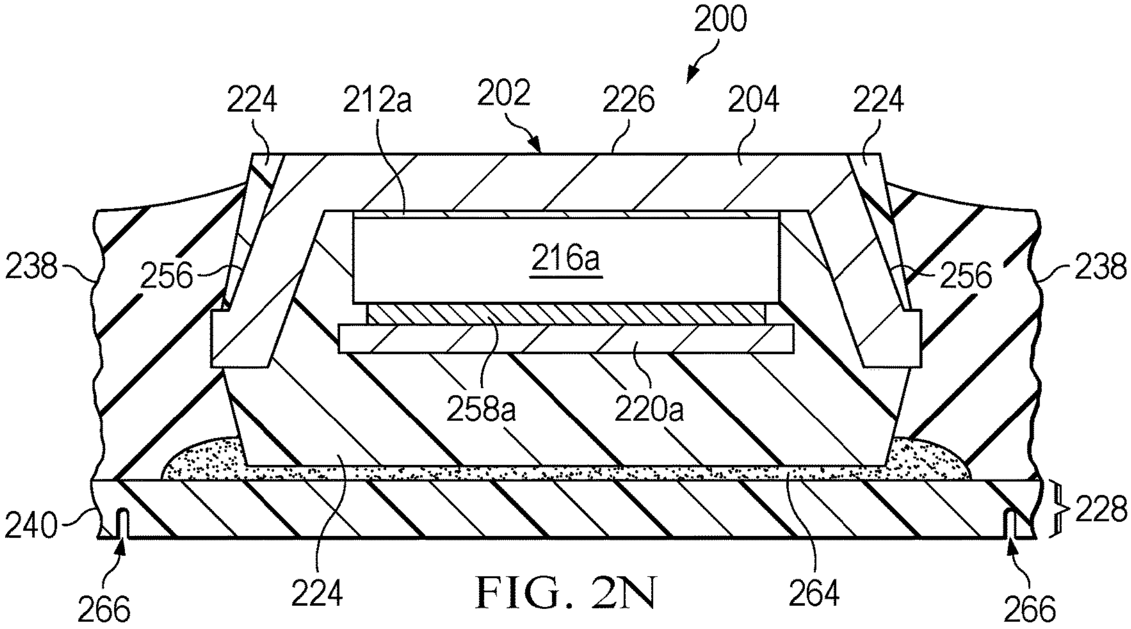
Figure 2O:
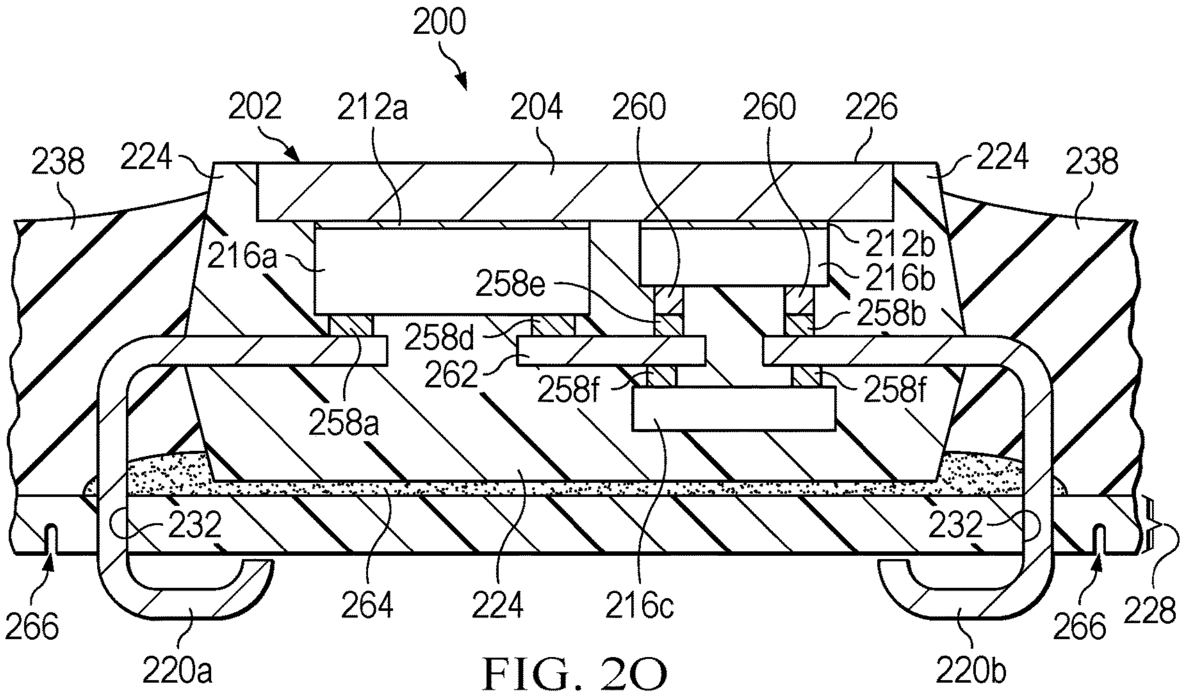
Figure 2P:
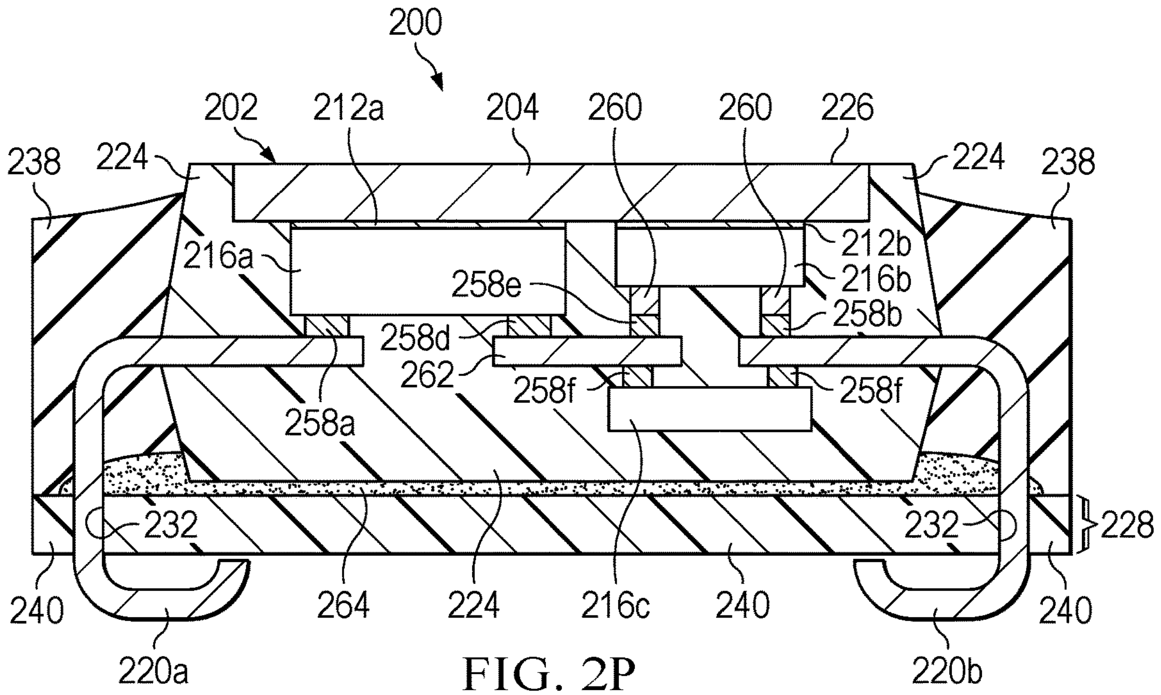
Figure 2Q:
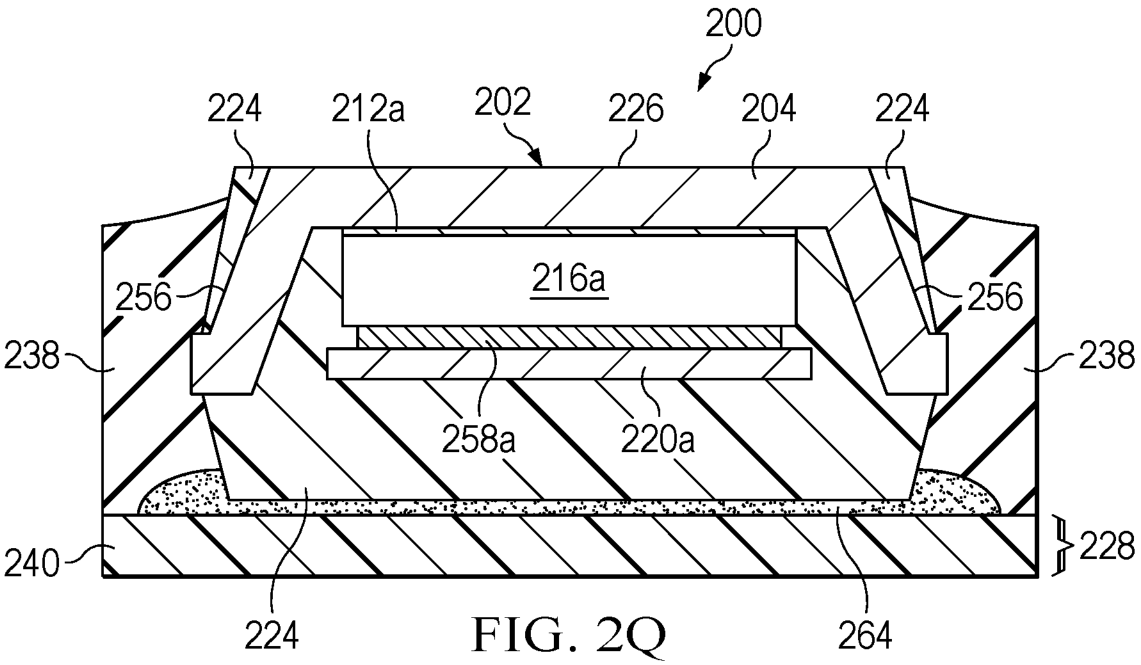
Figure 2R:
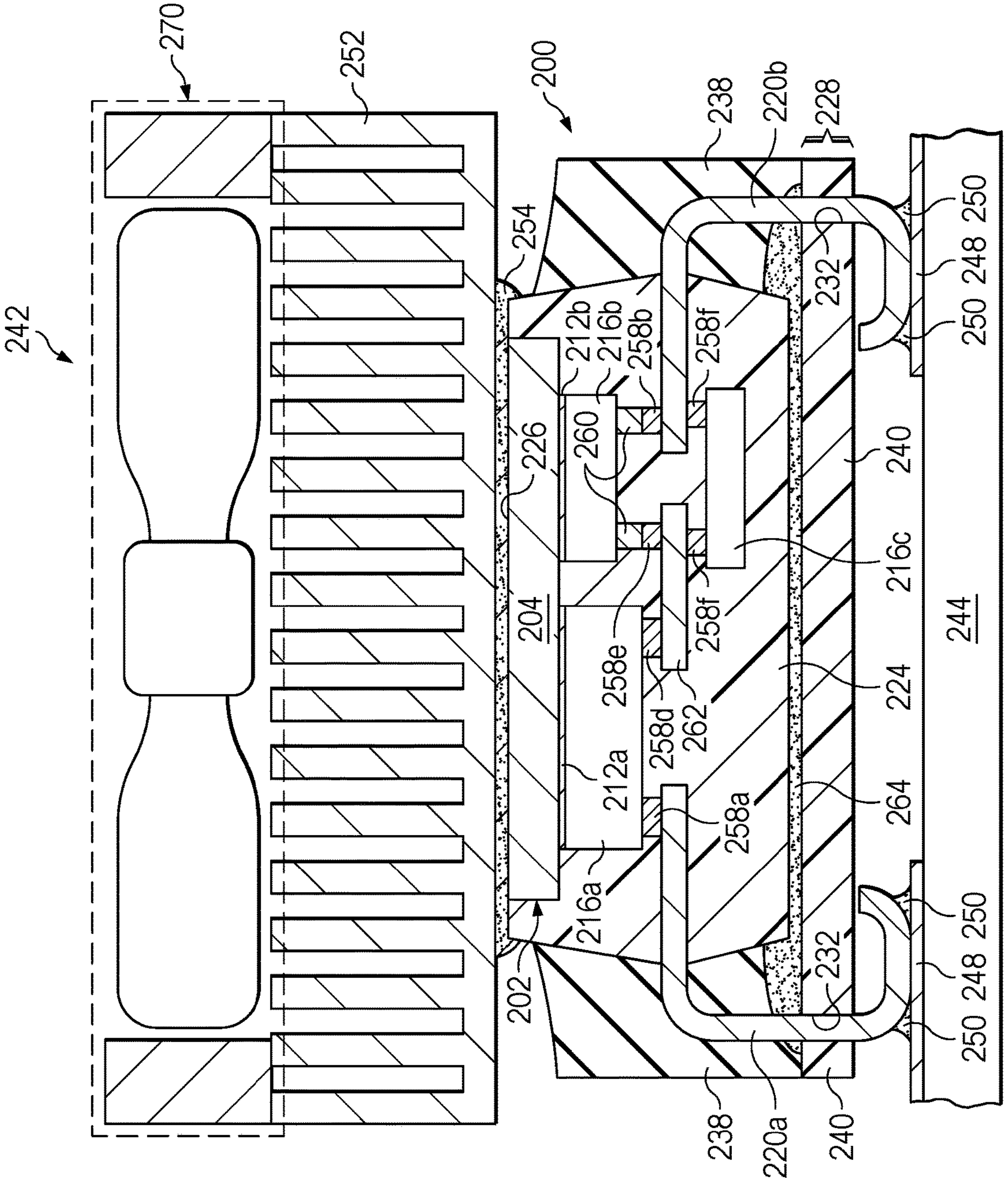

FIG. 2A through FIG. 2R are top views and cross sections of another example microelectronic device, depicted in stages of another example method of formation. Referring to FIG. 2A, a top view, FIG. 2B, a cross section, and FIG. 2C, a cross section, the microelectronic device (200) includes a package substrate (202). The package substrate (202) of this example includes a die pad (204) and struts (256) that connect the die pad (204) to a die pad frame, not shown. The package substrate (202) may be formed of copper, nickel coated copper, a DBC lamina or an IMS, by way of example.

In this example, the microelectronic device (200) includes a first electronic component (216*a*) attached to the die pad (204) by a first die attach material (212*a*), and a second electronic component (216*b*) attached to the die pad (204) by a second die attach material (212*b*). The first electronic component (216*a*) may be manifested as a semiconductor device, such as a GaN FET, a MOSFET, or an integrated circuit, by way of example. The second electronic component (216*b*) may also be manifested as a semiconductor device. In one version of this example, the first electronic component (216*a*) may be manifested as a depletion mode (normally on) GaN FET and the second electronic component (216*b*) may be manifested as a silicon MOSFET, connected in a cascode circuit to provide effective normally off functionality for the microelectronic device (200). The first die attach material (212*a*) and the second die attach material (212*b*) may be manifested as solder or electrically conductive adhesive, by way of example.

The microelectronic device (200) includes first leads (220*a*) of a lead frame, not shown, electrically connected to the first electronic component (216*a*) through a first solder joint (258*a*). The first leads (220*a*) may be combined over the first solder joint (258*a*), as depicted in FIG. 2A. In the version of this example in which the first electronic component (216*a*) is manifested as a depletion mode GaN FET, the first leads (220*a*) may be connected to a drain of the depletion mode GaN FET through the first solder joint (258*a*).

The second electronic component (216*b*) may include copper pillars (260) to provide electrical connection and reduce mechanical stress. The microelectronic device (200) includes second leads (220*b*) of the lead frame electrically connected to the second electronic component (216*b*) through second solder joints (258*b*) on instances of the copper pillars (260). The second leads (220*b*) may be combined over the second solder joints (258*b*), as depicted in FIG. 2A. In the version of this example in which the second electronic component (216*b*) is manifested as a silicon MOSFET, the second leads (220*b*) may be connected to a source of the silicon MOSFET through the second solder joints (258*b*). The second leads (220*b*) may also be connected to a gate of the depletion mode GaN FET through a third solder joint (258*c*) as part of the cascode circuit, as depicted in FIG. 2A.

The microelectronic device (200) includes a clip (262) of the lead frame electrically connected to the first electronic component (216*a*) through a fourth solder joint (258*d*) and electrically connected to the second electronic component (216*b*) through fifth solder joints (258*e*) on additional instances of the copper pillars (260). The clip (262) of this example may connect a source of the depletion mode GaN FET to a drain of the silicon MOSFET as part of the cascode circuit.

In this example, the microelectronic device (200) includes a third lead (220*c*) electrically connected to the second electronic component (216*b*) through a wire bond (222). The third lead (220*c*) may be electrically connected to a gate of the silicon MOSFET as part of the cascode circuit.

The microelectronic device (200) includes a third electronic component (216*c*) electrically connected to the first electronic component (216*a*) through the first leads (220*a*) and instances of sixth solder joints (258*f*), and electrically connected to the second electronic component (216*b*) through the second leads (220*b*) and additional instances of the sixth solder joints (258*f*). The third electronic component (216*c*) may be manifested as a passive component, such as a capacitor or resistor. In this example, the third electronic component (216*c*) may provide a compensating capacitor of the cascode circuit.

Referring to FIG. 2D, a top view, FIG. 2E, a cross section, and FIG. 2F, a cross section, an encapsulation material (224) is formed on the package substrate (202), the electronic components (216*a*), (216*b*) and (216*c*), the leads (220*a*), (220*b*), and (220*c*), the clip (262), and the wire bond (222). An exposed surface (226) of the package substrate (202) extends through the encapsulation material (224) and is exposed on the microelectronic device (200). The encapsulation material (224) may have a composition as disclosed for the encapsulation material (124) in reference to FIG. 1G and FIG. 1H, and may be formed by a similar process. The encapsulation material (224) may be formed by a FAM process, a post-mold grinding process, or other encapsulation process.

Referring to FIG. 2G, a top view, FIG. 2H, a cross section, and FIG. 2I, a cross section, the leads (220*a*), (220*b*), and (220*c*) and the struts (256) are trimmed, separating the microelectronic device (200) from the lead frame and the die pad frame. Subsequently, the leads (220*a*), (220*b*), and (220*c*) are shaped so that ends of the leads (220*a*), (220*b*), and (220*c*) extend away from the exposed surface (226) of the package substrate (202).

Referring to FIG. 2J, a top view, FIG. 2K, a cross section, and FIG. 2L, a cross section, a carrier plate (228) is attached to the leads (220*a*), (220*b*), and (220*c*), opposite from the exposed surface (226). In this example, the carrier plate (228) may include ceramic or other dielectric material, with holes (232). The carrier plate (228) is attached so that the leads (220*a*), (220*b*), and (220*c*) extend through the holes (232). Adhesive (264) may be used to attach the encapsulation material (224) and the leads (220*a*), (220*b*), and (220*c*) to the carrier plate (228), sealing the holes (232). The carrier plate (228) may accommodate multiple other microelectronic devices, not shown. The carrier plate (228) may include partial perforations (266) to facilitate singulation of the microelectronic device (200).

Referring to FIG. 2M, a cross section in the same plane as FIG. 2K, and referring to FIG. 2N, a cross section in the same plane as FIG. 2L, a shielding dielectric material (238) is formed on the leads (220*a*) and (220*b*), and (220*c*) shown in FIG. 2J, the carrier plate (228), and the encapsulation material (224). The shielding dielectric material (238) laterally surrounds the leads (220*a*) and (220*b*), and (220*c*) shown in FIG. 2J, and extends over the leads (220*a*) and (220*b*), and (220*c*) shown in FIG. 2J between the leads (220*a*) and (220*b*), and (220*c*) shown in FIG. 2J and the exposed surface (226) of the package substrate (202). The shielding dielectric material (238) may include epoxy or other polymer material. The exposed surface (226) of the package substrate (202) remains exposed after the shielding dielectric material (238) is formed. The shielding dielectric material (238) may be formed by an additive process, such as a nozzle dispense process. In one version of this example, the shielding dielectric material (238) may be recessed from the exposed surface (226) of the package substrate (202), as depicted in FIG. 2M and FIG. 2N. In another version, the shielding dielectric material (238) may be coplanar with the exposed surface (226) of the package substrate (202). The adhesive (264) around the holes (232) may advantageously reduce, or eliminate, leakage of the shielding dielectric material (238) through the holes (232).

Referring to FIG. 2O, a cross section in the same plane as FIG. 2M, exposed portions of the leads (220*a*) and (220*b*), and (220*c*) shown in FIG. 2J are shaped to form "J-leads" which curve back toward the carrier plate (228). The J-lead configuration of the leads (220*a*) and (220*b*), and (220*c*) shown in FIG. 2J may provide surface mount technology (SMT) capability for the microelectronic device (200), advantageously enabling electrically connecting the microelectronic device (200) to a circuit board without requiring holes in the circuit board.

Referring to FIG. 2P, a cross section in the same plane as FIG. 2O, and referring to FIG. 2Q, a cross section in the same plane as FIG. 2N, the microelectronic device (200) is singulated by cutting through the carrier plate (228) and the shielding dielectric material (238). The portion of the carrier plate (228) attached to the leads (220*a*) and (220*b*), and (220*c*) shown in FIG. 2J after singulation provides a carrier (240) of the microelectronic device (200). The carrier plate (228) and the shielding dielectric material (238) may be cut by a saw process, a water jet process, a laser cutting process, or other singulation process. The partial perforations (266) of FIG. 2J through FIG. 2O may advantageously facilitate singulation of the carrier plate (228).

Referring to FIG. 2R, a cross section in the same plane as FIG. 2P, the microelectronic device (200) is installed in an electronic system (242). The electronic system (242) includes a circuit board (244) with traces (248). The microelectronic device (200) is mounted in the circuit board (244), with the leads (220*a*) and (220*b*), and (220*c*) shown in FIG. 2J electrically connected to the traces (248) with solder (250).

A heatsink (252) is installed on the exposed surface (226) of the package substrate (202) with a thermally conductive material (254). The heatsink (252) may be manifested as a metal plate with cooling fins. The heatsink (252) may extend laterally past the shielding dielectric material (238), as depicted in FIG. 2R, to provide the advantage disclosed in reference to the heatsink (152) of FIG. 1Q. A cooling fan (270) may be attached to the heatsink (252) to increase removal of heat from the first electronic components (216*a*), (216*b*), and (216*c*).

Figure 3A:
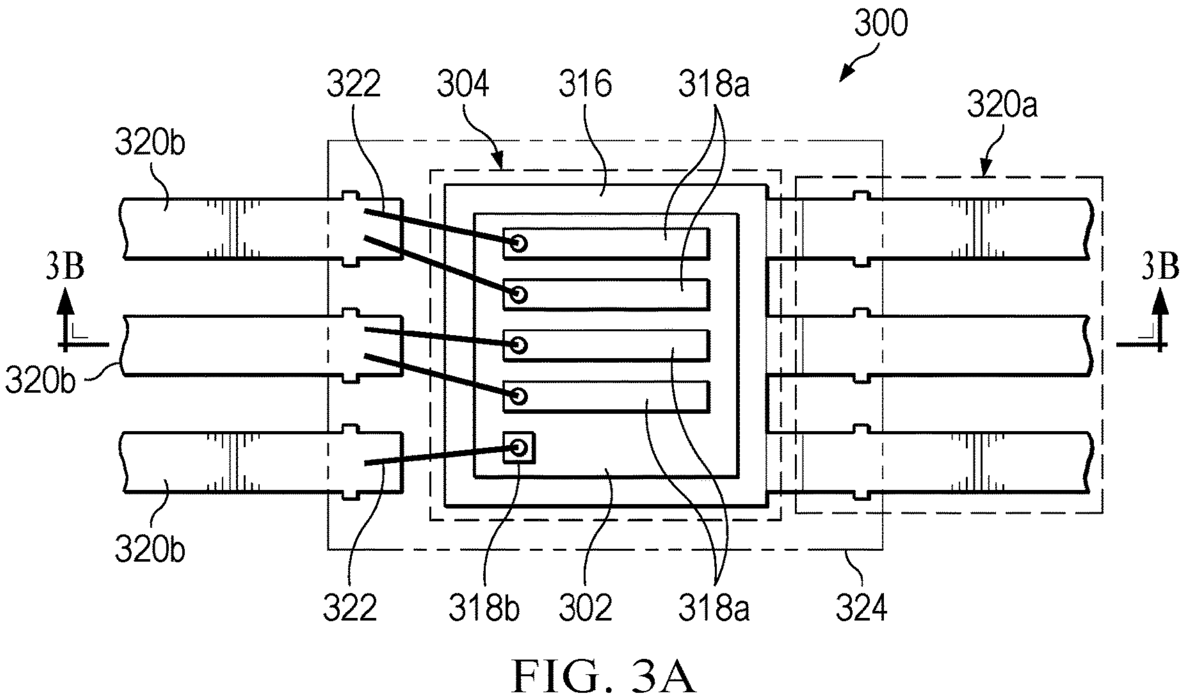
FIG. 3A through FIG. 3F are top views and cross sections of a further example microelectronic device, depicted in stages of a further example method of formation.

FIG. 3A through FIG. 3F are top views and cross sections of a further example microelectronic device, depicted in stages of a further example method of formation. Referring to FIG. 3A, a top view, and FIG. 3B, a cross section, the microelectronic device (300) includes a package substrate (302). The package substrate (302) of this example includes a die pad (304). The package substrate (302) may be formed of copper or nickel plated copper, by way of example. The microelectronic device (300) includes first leads (320*a*) directly connected to the package substrate (302). The first leads (320*a*) are thus electrically connected to the die pad (304). The microelectronic device (300) includes second leads (320*b*) that are not connected to the die pad (304). The leads (320*a*) and (320*b*) are connected to a lead frame, not shown. The leads (320*a*) and (320*b*) may have the same composition as the die pad (304).

An electronic component (316) is attached to the die pad (304) with a die attach material (312) such as solder or electrically conductive adhesive. In this example, the electronic component (316) may be manifested as a vertical MOS FET or a vertical silicon carbide (SiC) transistor. The electronic component (316) may have a drain extending to a back surface of a semiconductor substrate of the electronic component (316), in contact with the die attach material (312). The electronic component (316) includes source bond pads (318*a*) and a gate bond pad (318*b*). The source bond pads (318*a*) and the gate bond pad (318*b*) are electrically connected to the second leads (320*b*) through electrical connections (322), which may be manifested as wire bonds. Alternatively, the electrical connections (322) may be manifested as ribbon bonds or wedge bonds.

An encapsulation material (324) is formed on the package substrate (302), the electronic component (316), the leads (320*a*) and (320*b*), and the electrical connections (322). An exposed surface (326) of the package substrate (302) extends through the encapsulation material (324) and is exposed on the microelectronic device (300). The encapsulation material (324) may have a composition as disclosed for the encapsulation material (124) in reference to FIG. 1G and FIG. 1H, and may be formed by a similar process.

Figure 3B:
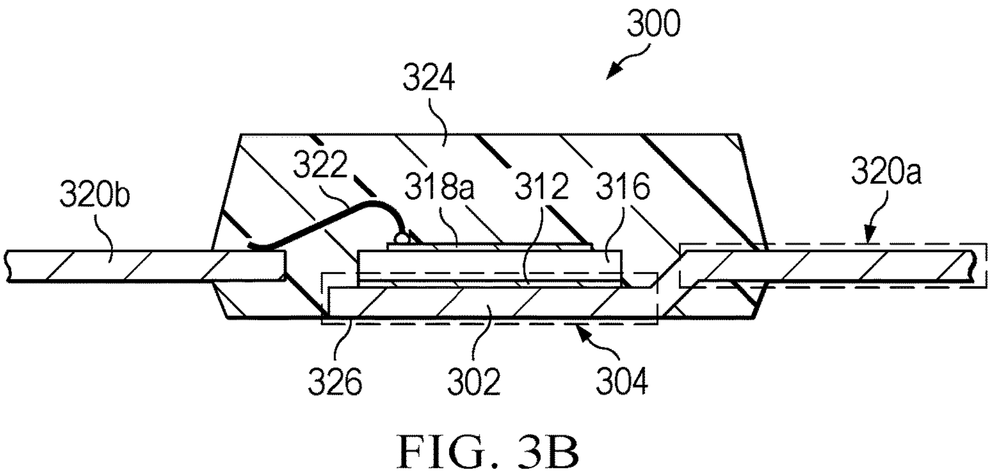
Figure 3C:
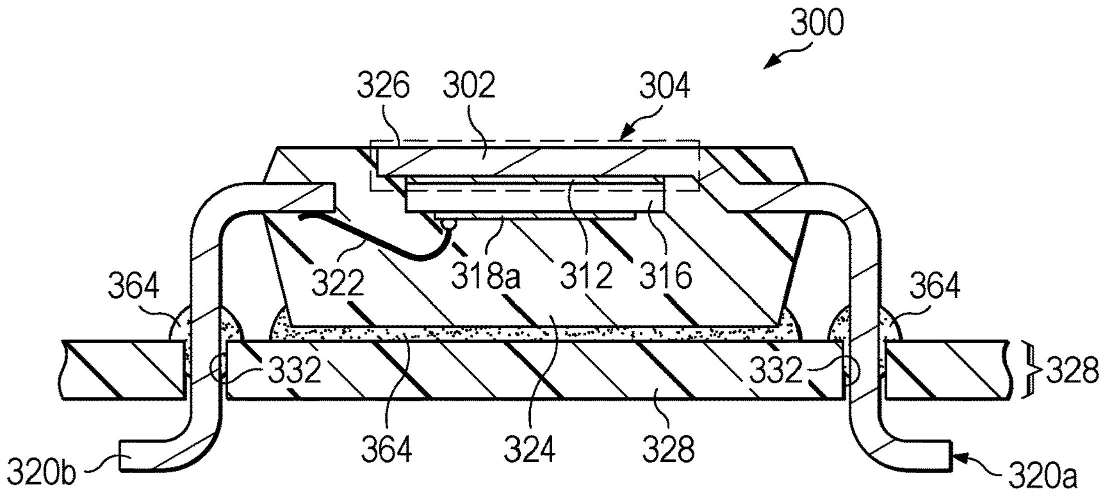

Referring to FIG. 3C, a cross section in the same plane as FIG. 3B, the leads (320*a*) and (320*b*) are trimmed, separating the microelectronic device (300) from the lead frame. Subsequently, the leads (320*a*) and (320*b*) are shaped so that ends of the leads (320*a*) and (320*b*) extend away from the exposed surface (326) of the package substrate (302).

A carrier plate (328) is attached to the leads (320*a*) and (320*b*), opposite from the exposed surface (326). The carrier plate (328) may include ceramic, FRP, or other dielectric material, with holes (332). The carrier plate (328) is attached so that the leads (320*a*) and (320*b*) extend through the holes (332). Adhesive (364) may be used to attach the encapsulation material (324) and the leads (320*a*) and (320*b*) to the carrier plate (328), sealing the holes (332). The carrier plate (328) may accommodate multiple other microelectronic devices, not shown.

Exposed portions of the leads (320*a*) and (320*b*) are shaped to form gull wing leads which extend outward, parallel to the carrier plate (328). The gull wing configuration of the leads (320*a*) and (320*b*) may provide SMT capability for the microelectronic device (300) having a larger contact area than other SMT lead configurations.

Figure 3D:
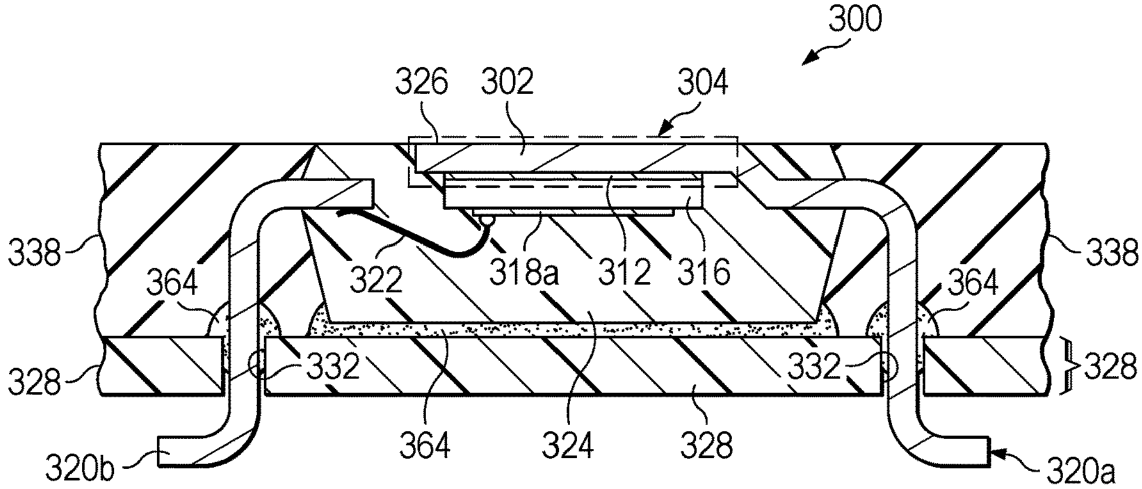

Referring to FIG. 3D, a cross section in the same plane as FIG. 3C, a shielding dielectric material (338) is formed on the leads (320*a*) and (320*b*), the carrier plate (328), and the encapsulation material (324). The shielding dielectric material (338) laterally surrounds the leads (320*a*) and (320*b*), and extends over the leads (320*a*) and (320*b*) between the leads (320*a*) and (320*b*) and the exposed surface (326) of the package substrate (302). The shielding dielectric material (338) is electrically non-conductive. The package substrate (302) remains exposed at the exposed surface (326) after the shielding dielectric material (338) is formed. The shielding dielectric material (338) may be formed by a FAM process, an injection molding process, or an additive process, by way of example. The adhesive (364) around the holes (332) may advantageously reduce, or eliminate, leakage of the shielding dielectric material (338) through the holes (332).

Figure 3E:
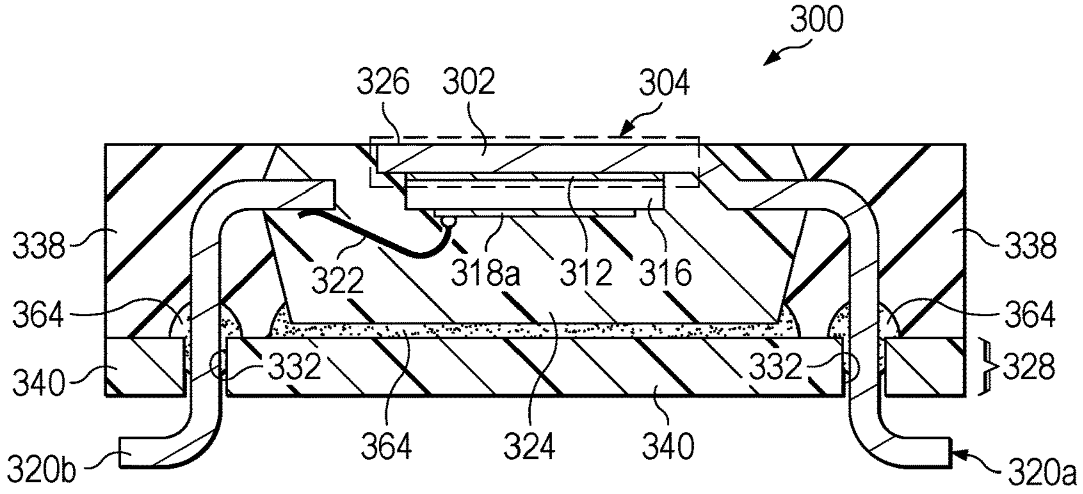

Referring to FIG. 3E, a cross section in the same plane as FIG. 3D, the microelectronic device (300) is singulated by cutting through the carrier plate (328) and the shielding dielectric material (338). The portion of the carrier plate (328) attached to the leads (320*a*) and (320*b*) after singulation provides a carrier (340) of the microelectronic device (300). The carrier plate (328) and the shielding dielectric material (338) may be cut by any of the singulation processes disclosed herein.

Figure 3F:
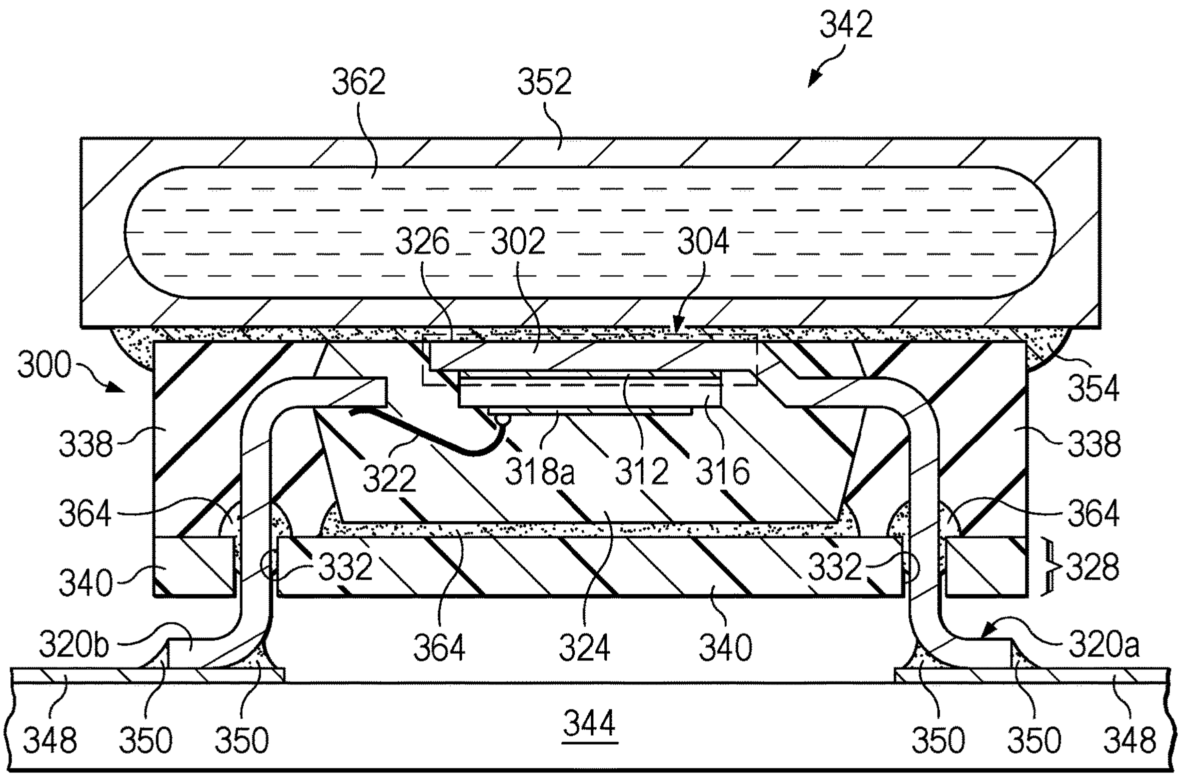

Referring to FIG. 3F, a cross section in the same plane as FIG. 3D, the microelectronic device (300) is installed in an electronic system (342). The electronic system (342) includes a circuit board (344) with traces (348). The microelectronic device (300) is mounted in the circuit board (344), with the leads (320*a*) and (320*b*) electrically connected to the traces (348) with solder (350).

A heatsink (352) is installed on the exposed surface (326) of the package substrate (302) with a thermally conductive material (354). The heatsink (352) may be manifested as a metal block with an internal channel containing a liquid coolant (362) such as water, deionized water, a glycol/water solution, a fluorocarbon, or a synthetic hydrocarbon. The heatsink (352) may extend laterally past the shielding dielectric material (338), as depicted in FIG. 3F, to provide the advantage disclosed in reference to the heatsink (152) of FIG. 1Q.

Various features of the examples disclosed herein may be combined in other manifestations of example microelectronic devices. For example, the microelectronic device (200) of FIG. 2R or the microelectronic device (300) of FIG. 3F may include a laminated material such as DBC or IMS in the package substrate (202) or (302), respectively. The microelectronic device (100) of FIG. 1Q may have a solid metal package substrate (102). The microelectronic device (100) or the microelectronic device (300) may include more than one electronic component attached to the die pad (104) or (304), respectively. The microelectronic device (200) may have only one electronic component attached to the die pad (204). Any of the microelectronic device (100), the microelectronic device (200), or the microelectronic device (300) may connect the electronic components (116), (216*a*) through (216*c*), or (316) to the leads (120), (220*a*) through (220*c*), or (320*a*) and (320*b*), by any combination of wire bonds, wedge bonds, ribbon bonds, solder joints, or clips. Any of the microelectronic device (100), the microelectronic device (200), or the microelectronic device (300) may have carriers (140), (240), or (340), respectively, that include ceramic, FRP, or other electrically non-conductive material. Any of the microelectronic device (100), the microelectronic device (200), or the microelectronic device (300) may have solder or adhesive connecting the leads (120), (220*a*) through (220*c*), or (320*a*) and (320*b*) to the carriers (140), (240), or (340). Any of the microelectronic device (100), the microelectronic device (200), or the microelectronic device (300) may have adhesive or shielding dielectric material between the encapsulation material (124), (224), or (324) and the carriers (140), (240), or (340). Any of the microelectronic device (100), the microelectronic device (200), or the microelectronic device (300) may have leads (120), (220*a*) through (220*c*), or (320*a*) and (320*b*) with straight configurations, J-lead configurations, gull wing configurations, or other lead configurations.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A microelectronic device, comprising:
an electronic component attached to a package substrate, the package substrate having an exposed surface on the microelectronic device;
a lead electrically connected to the electronic component, the lead extending away from the exposed surface of the package substrate; and
a shielding dielectric material laterally surrounding the lead, wherein the electronic component and the package substrate are contacted by an encapsulation material, separate from the shielding dielectric material.

2. The microelectronic device of claim 1, wherein the microelectronic device includes a carrier located opposite from the exposed surface of the package substrate, the lead extending through the carrier.

3. The microelectronic device of claim 1, further including:
a second electronic component attached to the package substrate; and
a second lead electrically connected to the second electronic component, extending away from the exposed surface of the package substrate, and laterally surrounded by the shielding dielectric material.

4. The microelectronic device of claim 1, wherein the lead has a straight configuration extending away from the exposed surface of the package substrate.

5. The microelectronic device of claim 1, wherein the lead has a J-lead configuration.

6. The microelectronic device of claim 1, wherein the lead has a gull wing configuration.

7. A method of forming a microelectronic device, comprising:
forming a shielding dielectric material laterally surrounding a lead, wherein:
the lead is electrically connected to an electronic component of the microelectronic device;
the electronic component is attached to a package substrate of the microelectronic device;
the lead, the electronic component, and the package substrate are contacted by encapsulation material;
an exposed surface of the package substrate extends through the encapsulation material and is exposed on the microelectronic device; and
the lead extends away from the exposed surface of the package substrate.

8. The method of claim 7, further including attaching a carrier to the lead, opposite from the exposed surface of the package substrate, before forming the shielding dielectric material, the lead extending through the carrier.

9. The method of claim 7, further including singulating the microelectronic device by cutting through the shielding dielectric material around a perimeter of the microelectronic device.

10. The method of claim 7, further including:
forming the shielding dielectric material laterally surrounding a second lead, wherein:
the second lead is electrically connected to a second electronic component of the microelectronic device;
the second electronic component is attached to the package substrate;
the second lead and the second electronic component are contacted by encapsulation material; and
the second lead extends away from the exposed surface of the package substrate.

11. The method of claim 7, further including forming the lead into a J-lead.

12. The method of claim 7, further including forming the lead into a gull wing lead.

13. An electronic system, comprising:

a microelectronic device, including:

an integrated circuit or discrete transistor attached to a package substrate, the package substrate having an exposed surface on the microelectronic device;

a lead electrically connected to the integrated circuit or discrete transistor, the lead extending away from the exposed surface of the package substrate;

a shielding dielectric material laterally surrounding the lead;

a second integrated circuit or discrete transistor attached to the package substrate; and a circuit board electrically connected to the lead; and a heatsink attached to the exposed surface of the package substrate.

14. The electronic system of claim 13, wherein the heatsink is electrically conductive and extends laterally past the shielding dielectric material.

15. The electronic system of claim 13, wherein the microelectronic device includes a carrier located opposite from the exposed surface of the package substrate, the lead extending through the carrier.

16. The electronic system of claim 14, the microelectronic device further including:

a second lead electrically connected to the second integrated circuit or discrete transistor, extending away from the exposed surface of the package substrate, and laterally surrounded by the shielding dielectric material.

17. The electronic system of claim 13, wherein the lead has a straight configuration and extends through the circuit board.

18. The electronic system of claim 13, wherein the lead has a J-lead configuration.

19. The electronic system of claim 13, wherein the lead has a gull wing configuration.

20. A microelectronic device, comprising:

A first integrated circuit or transistor attached to a package substrate, the package substrate having an exposed surface on the microelectronic device;

a lead electrically connected to the electronic component, the lead extending away from the exposed surface of the package substrate;

a second integrated circuit or transistor attached to the package substrate;

an encapsulation material on the package substrate, the first integrated circuit or transistor, the second integrated circuit or transistor and on a portion of the leads;

a shielding dielectric material on the encapsulation material and laterally surrounding a portion of the lead.

* * * * *